(12) United States Patent
Shimizu et al.

(10) Patent No.: US 6,698,346 B2
(45) Date of Patent: Mar. 2, 2004

(54) SCREEN-PRINTING MATERIAL REPLENISHING DEVICE

(75) Inventors: Toshinori Shimizu, Kariya (JP); Manabu Mizuno, Toyota (JP); Jun Adachi, Nagoya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 103 days.

(21) Appl. No.: 09/984,065

(22) Filed: Oct. 26, 2001

(65) Prior Publication Data

US 2002/0050217 A1 May 2, 2002

(30) Foreign Application Priority Data

Oct. 31, 2000 (JP) ........................ 2000-332831

(51) Int. Cl.[7] ............................ B41F 15/40; B05C 11/10
(52) U.S. Cl. ........................ 101/123; 101/114; 222/80
(58) Field of Search ................................ 101/114, 123, 101/124, 129; 118/602, 406; 427/96, 282, 207.1; 228/33, 39; 83/200.1, 651.1; 222/80, 548; 141/110, 111

(56) References Cited

U.S. PATENT DOCUMENTS 2,603,867 A * 7/1952 Van Guilder ............... 425/172
2,769,576 A * 11/1956 Stevens ....................... 222/80
5,797,516 A * 8/1998 Brandl ......................... 222/80
5,865,117 A    2/1999 Asai et al.

FOREIGN PATENT DOCUMENTS

JP         08-48024    * 2/1996
JP      A 11-227156      8/1999

OTHER PUBLICATIONS

Machine translation of JP 08–48024, pp. 1–18.*
Machine translation of JP 11–227156, pp. 1–9.*

* cited by examiner

Primary Examiner—Leslie J. Evanisko
(74) Attorney, Agent, or Firm—Oliff & Berridge, PLC

(57) ABSTRACT

A printing-agent replenishing device including a replenisher which has a container for accommodating a printing agent and a delivery nozzle disposed at one end of the container and which is operable to delivery the printing agent from the delivery nozzle, for replenishing a printing-agent replenishment object in a screen printer, the device further including a cutting wire for cutting off a mass of the printing agent which extends from a free end of the delivery nozzle, and a cutting-wire holding device which holds the cutting wire such that the cutting wire is held in contact with or in close proximity to the free end face of the delivery nozzle, so as to traverse an opening in the free end face, and such that the cutting wire is rotatable about an axis substantially aligned with an axis of the delivery nozzle.

42 Claims, 17 Drawing Sheets

SCREEN-PRINTING MATERIAL REPLENISHING DEVICE

This application is based on Japanese Patent Application No. 2000-332831 filed on Oct. 31, 2000, the contents of which are incorporated hereinto by reference.

BACKGROUND OF THE INVENTION

1. Field of the Invention

The present invention relates in general to a screen-printing agent replenishing device, and more particularly to a device arranged to replenish a screen printer with a printing agent.

2. Discussion of Related Art

A screen printer is used, for example, to apply a printing agent such as a solder paste (solder cream) to a circuit substrate such as a printed-wiring board, by a screen printing technique. JP-A-11-227156 discloses an example of this type of screen printer, wherein a solder paste is printed onto the circuit substrate through a mesh of a printing screen or stencil while a mass of the solder paste is moved on the screen by a squeegee. When it becomes necessary to replenish the solder paste, a solder-paste replenishing device is operated to replenish the screen with a mass of the solder paste. Some type of screen printer uses a solder dispenser of closed or sealed type for accommodating a solder paste, and an extruder for extruding a mass of the solder paste from the solder dispenser to be printed on the circuit substrate. In this type of screen printer, the solder dispenser is replenished with the solder paste.

For example, the solder-paste replenishing device includes a solder-paste container for accommodating a solder paste, an extruding device for extruding the solder paste from the solder-paste container, and a moving device for moving the solder-paste container and the extruding device relative to the printing screen. When the solder paste is replenished, the solder-paste container is moved by the moving device to a position above the printing screen, and the solder paste is extruded by the extruding device from the solder-paste container, so that the extruded solder paste is fed through a delivery nozzle onto the screen or into the solder dispenser. When the extrusion of the solder paste from the extruder is terminated, a mass of the solder paste may bridge a space between the discharge open end of the delivery nozzle and the screen or the solder dispenser, or may droop down from the discharge end of the deliver nozzle.

In view of the above drawbacks, the solder-paste replenishing device used in the screen printer disclosed in the above-identified publication is provided with a solder-paste cut-off device operable to cut off the solder paste upon termination of the extrusion of the solder paste from the delivery nozzle. The cut-off device is arranged to cut-off the solder paste with a cutting gut. The cutting gut is held by a body of the cut-off device, and includes a cut-off portion extending in a diametric direction of the delivery nozzle. The solder-paste cut-off device and the solder-paste container are mounted on a vertically movable member, so that the solder-paste cut-off device can be vertically moved with the vertically movable member toward and away from the printing screen. The vertically movable member is moved by the above-indicated moving device, so that the solder-paste cut-off device can be moved in a plane parallel to the screen. The solder-paste cut-off device is mounted on the vertically movable member such that the cut-off device is movable by a drive device, relative to the solder-paste container in two mutually perpendicular directions that are parallel to the axis of the delivery nozzle and the direction of extension of the cut-off portion of the cutting gut, respectively. With movements of the solder-paste cut-off device by the drive device relative to the solder-paste container, the cut-off portion of the cutting gut can be positioned such that the cut-off portion extends at right angles with respect to a mass of the solder paste as delivered from the delivery nozzle, and such that the cut-off portion is located slightly below the discharge open end of the delivery nozzle.

However, there are various problems encountered when the solder paste is cut off. For instance, the problems includes a need of moving the solder-paste cut-off device relative to the delivery nozzle of the solder-paste container, for cutting off the solder paste, with a result of increased complexity of the solder-paste replenishing device. Another problem is difficulty of the cutting gut to cut off the solder paste due to the operating position of the gut which is only slightly spaced from the discharge open end of the delivery nozzle. This difficulty results in possible contamination of the open end face of the delivery nozzle and the adjacent components with the solder paste. Namely, a piece of the solder paste adhering to the cutting gut may be transferred onto the open end face of the delivery nozzle. Where the screen printer uses a solder paste which is relatively hard to be cut off, the components near the discharge open end of the delivery nozzle are likely to be contaminated with a piece of the solder paste not completely cut-off.

A further problem is a need of adjustment of a distance between the cut-off portion of the cutting gut and the discharge open end of the delivery nozzle, with a result of an increased time required for the adjustment and inspection of the distance. In addition, replenishment of the solder dispenser with the solder paste and replacement of the broken cutting gut with a new one may require removal of at least one of the solder-paste container and the solder-paste cut-off device from the vertically movable member. In this instance, the above-indicated distance must be re-adjusted, and this re-adjustment is time-consuming and cumbersome.

It is also noted that the solder-paste container is mounted with its delivery nozzle extending downwards, so that the solder paste droop downwards from the discharge end of the delivery nozzle due to its own weight when the container waits for the replenishment of the solder paste. The solder paste drooping from the delivery nozzle may drop down off the delivery nozzle, resulting in wasting of the solder paste.

While the problems where a solder paste is used as a printing agent for a screen printer have been described, similar problems are encountered where a screen printer is provided with a printing-agent replenishing device for replenishing a container with other printing agents: such as a soldering aid in the form of a paste which does not include a solder and is applied to a circuit substrate, in order to facilitate a soldering operation on the circuit substrate; and an adhesive agent used for bonding electric components (typically, electronic components) to a circuit substrate. Further, similar problems are encountered where a screen printer is provided with a printing-agent replenishing device for replenishing a dispenser or other printing-agent replenishment object with a printing agent to be applied to an object other than circuit substrates such as a printed-wiring board.

SUMMARY OF THE INVENTION

The present invention was made in view of the background art discussed above. It is therefore an object of the present invention to provide a printing-agent replenishing device which includes a replenisher having a container for accommodating a printing agent and a delivery nozzle at one end of the container and operable to deliver the printing agent from the delivery nozzle for replenishing a printing-agent replenishment object in a screen printer, and which does not suffer from at least one of the above-described problems, that is, structural complexity, contamination with the printing agent upon cutting-off of the printing agent, requirement for cumbersome adjustment of the relative position of the printing-agent container and the printing-agent cut-off device, and drooping of the printing agent. The above object may be achieved according to any one of the following modes of the present invention, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A printing-agent replenishing device including a replenisher which has a container for accommodating a printing agent and a delivery nozzle disposed at one end of the container and which is operable to delivery the printing agent from the delivery nozzle, for replenishing a printing-agent replenishment object in a screen printer, comprising:

a cutting wire for cutting off a mass of said printing agent which extends from a free end of the delivery nozzle; and a cutting-wire holding device which holds the cutting wire such that the cutting wire is held in contact with or in close proximity to a face of the free end of the delivery nozzle, so as to traverse an opening in the end face, and such that the cutting wire is rotatable about an axis substantially aligned with an axis of the delivery nozzle.

The printing agent most typically used in a screen printer is an ink. Where, the workpiece on which a printing operation is performed by the screen printer is a circuit substrate, the printing agent is a solder paste or cream, or an adhesive agent.

The printing-agent replenishment object may be a printing screen or stencil, or a printing-agent dispenser of sealed type. The cutting wire may be a wire formed of a hard synthetic resin material, but is preferably a metallic wire which has a high strength even where the diameter is relatively small. More preferably, the cutting wire is a metallic wire formed of a spring material. The cutting wire may be rotated by a rotary drive device including a power-drive source, or manually. The cutting wire may be attached to the replenisher, as described below with respect to the following mode (2) of this invention, or to a replenisher-holding device provided to hold the replenisher. In the latter case, the cutting wire is held in contact with or in close proximity to the free end face of the delivery nozzle of the replenisher when the replenisher is held by the replenisher-holding device.

When the cutting wire which traverses the opening in the free end face of the delivery nozzle is rotated by at least a half turn (through at least 180°), a mass of the printing agent extending from the free end of the delivery nozzle can be completely cut off. Where the printing agent is cut off by a cutting wire which is positioned so as to extend in a direction perpendicular to the longitudinal direction of the cutting wire, as in the conventional cut-off device, it is difficult to position the cutting wire in sufficiently close proximity to the free end face of the delivery nozzle, and is impossible to hold the cutting wire in contact with the free end face. In the conventional cut-off device, the printing agent is cut off by the cutting wire, by moving the cutting wire from a first position offset from the free end face of the delivery nozzle to a second position aligned with the free end face, and then moving the cutting wire back to the first position. Therefore, if the cutting wire is positioned close to the free end face, the cutting wire may interfere with the free end face of the delivery nozzle, and may be broken. In the printing-agent replenishing device according to the present invention, on the other hand, the printing agent is cut off by a rotary movement of the cutting wire while the portion of the cutting wire traversing the opening in the end face is held aligned with the opening, and is held in contact with or in close proximity to the end face, so that the printing agent mass extending from the free end of the delivery nozzle can be cut off with a high degree of stability.

Further, a cut-off device which includes the cutting wire and which is arranged to cut off the printing agent by rotating the cutting wire according to the present invention can be made simpler in construction and more compact than the conventional cutoff device which is arranged to cut off the printing agent by moving the cutting wire in a direction intersecting the axis of the delivery nozzle.

(2) A printing-agent replenishing device including a replenisher which has a container for accommodating a printing agent and a delivery nozzle disposed at one end of the container and which is operable to delivery the printing agent from the delivery nozzle, for replenishing a printing-agent replenishment object in a screen printer, comprising:

a rotary member mounted on the replenisher rotatably about an axis of the delivery nozzle; and a cutting wire attached to the rotary member such that the cutting wire traverses an opening in a face of a free end of the delivery nozzle.

The description of the printing-agent replenishing device according to the above mode (1) applies to the printing-agent replenishing device according to the present mode (2) of this invention.

In the printing-agent replenishing device according to the above mode (2), a rotary motion of the cutting wire by at least a half turn (through at least 180°) provides the same effect as a linear movement of the cutting wire in a direction intersecting the axis of the delivery nozzle, so as to traverse the free end opening, so that the printing agent can be completely cut off by the cutting wire.

As described below in detail, the cutting wire may be attached to the rotary member such that the cutting wire is held in contact with the free end face of the delivery nozzle, or in close proximity to the free end face, after the rotary member is mounted on the replenisher. In either case, the cutting wire may be arranged such that a portion of the cutting wire projects into the free end portion of the delivery nozzle. The cutting wire attached to the rotary member in the present printing-agent replenishing device does not require cumbersome adjustment of the relative position between the cutting wire and the free end of the delivery nozzle, which adjustment is required in the conventional printing-agent replenishing device arranged to cut off the printing agent by moving the cutting wire and the delivery nozzle relative to each other in a direction perpendicular to the axis of the delivery nozzle. In the conventional printing-agent replenishing device, the cutting-wire holding device holding the cutting wire and operable to move the cutting wire in the direction perpendicular to the axis of the delivery nozzle is held by a holder member which is distant from the printing-agent container, so that the relative position of the delivery nozzle and the cutting wire is influenced by the dimensional error of a relatively large number of components of the device. Accordingly, it is difficult to position the delivery nozzle and the cutting wire relative to each other with high accuracy in the conventional printing-agent replenishing device. Therefore, the conventional device requires a position-adjusting device for adjusting the relative position between the cutting wire and the delivery nozzle, and a cumbersome position-adjusting operation to adjust the relative position by manipulating the position-adjusting device. The present printing-agent replenishing device does not require such position-adjusting device and operation, since the rotary motion of the cutting wire permits the printing agent to be cut off and makes it possible to attach the cutting wire to the replenisher per se. Accordingly, the cutting wire and the delivery nozzle can be easily positioned relative to each other with a higher degree of accuracy, and the position-adjusting operation can be eliminated.

In addition, the cutting wire can be attached to and removed from the printing-agent replenishing device, together with the replenisher, that is, while the cutting wire is kept attached to the replenisher. Accordingly, the relative position between the delivery nozzle and the cutting wire remains unchanged even after the replenisher is removed from the device, so that the position-adjusting operation is not necessary when the replenisher is mounted again on the device. Further, the cutting wire attached to the replenisher of the present device can be generally made shorter than the cutting wire in the conventional device, and/or can be more easily prevented from interfering the surrounding components and/or being broken, than in the conventional device.

Further, since the cutting wire is attached to the replenisher, it is not necessary to adjust the relative position of the replenisher and the cutting wire when the replenisher is installed on the screen printer. Accordingly, the required time for installing the replenisher can be reduced, and the operation to install the replenisher can be simplified.

(3) A printing-agent replenishing device according to the above mode (2), further comprising: a holding member which holds the replenisher; and a rotary drive device including a drive source, disposed on the holding member and operable to rotate the rotary member.

The drive source of the rotary drive device may be a motor such as an electric motor, or a fluid-operated actuator such as a rotary air cylinder.

(4) A printing-agent replenishing device according to the above mode (3), wherein the rotary drive device includes: a driven rotary element rotatable with the rotary member; a rotary drive source supported by the holding member and serving as the drive source; and a rotary-motion transmitting device operable to transmit a rotary motion of the rotary drive device to the driven rotary element.

(5) A printing-agent replenishing device according to the above mode (3), further comprising a replenisher-holding device provided on the holding member and arranged to removably hold the replenisher, and wherein the rotary drive device further includes a driving rotary element, and a driven rotary element which is mounted on the replenisher such that the driven rotary element is rotatable with the rotary member, and such that the driven rotary element is engageable with the driving rotary element when the replenisher is held by the replenisher-holding device, and is disengageable from the driving rotary element when the replenisher is removed from the replenisher-holding device.

(6) A printing-agent replenishing device according to the above mode (5), wherein the replenisher-holding device includes a holder sleeve for removably holding the container, and a fixing device for fixing the holder sleeve to the holding member.

(7) A printing-agent replenishing device according to any one of the above modes (1)–(6), wherein the cutting wire includes a transverse portion traversing the opening in the face of the free end of the delivery nozzle, the transverse portion including an inward projection which projects into a free end portion of the delivery nozzle which has the opening.

In the printing-agent replenishing device according to the above mode (7), the printing agent is cut off inside the delivery nozzle when the cutting wire is rotated. Accordingly, even if a mass of the printing agent flows down from the cut-off position, this mass remains within the free end portion of the delivery nozzle, so that the drooping of the printing agent from the free end face of the nozzle can be effectively prevented.

(8) A printing-agent replenishing device according to the above mode (7), wherein the inward projection is shaped such a distance of the inward projection in an axial direction of the delivery nozzle to a plane including the face of the free end of the delivery nozzle is largest at a center of the above-indicated opening and decreases as the inward projection extends in a radially outward direction of the opening, and wherein the cutting wire further includes opposite end portions located outside the opening as seen in the above-indicated plane.

According to the above mode (8), the printing agent is cut off by the cutting wire, in a conical shape within the free end portion of the delivery nozzle. Where the replenisher is oriented such that the delivery nozzle extends almost upright with the free end located on the lower side, the mass of the printing agent within the free end portion of the delivery nozzle is less likely to flow or droop downwards at a radially outer position within the delivery nozzle, since a resistance to the flow of the printing agent is relatively high at the radially outer position due to contact of the printing agent to the inner circumferential surface of the delivery nozzle. At a radially central position within the delivery nozzle, the printing agent is likely to flow or droop downwards since the flow resistance is relatively low. In view of this tendency, the drooping of the printing agent from the free end of the nozzle can be effectively avoided, by cutting off the printing agent in a conical shape within the free end portion of the nozzle.

(9) A printing-agent replenishing device according to any one of the above modes (1)–(8), wherein the cutting wire is held in contact with the face of the end face of the delivery nozzle.

The cutting wire is rotated while it is held in contact with the free end face of the delivery nozzle, so that a mass of the printing agent outside the opening at the free end face can be completely cut off along the end face.

(10) A printing-agent replenishing device according to the above mode (9), wherein the cutting wire is held in contact with the face of the end face of the delivery nozzle under an elastic force of the cutting wire.

Where the cutting wire is held in contact with the free end face under the elastic force of the cutting wire per se, the cutting wire can be stably held in contact with the free end face, and the contact pressure between the cutting wire and the free end face can be easily controlled. Further, the present arrangement is effective to simplify the construction of the cut-off device and reduce the cost of manufacture, as compared with an arrangement wherein the cutting wire is held in contact with the free end face of the delivery nozzle under an elastic force of an exclusive elastic member used in addition to the cutting wire.

(11) A printing-agent replenishing device according to the above mode (10), wherein the cutting wire includes a contact portion held in contact with the face of the free end of the delivery nozzle, an engaging portion engageable with the rotary member, and an elastically deforming portion interposed between the engaging portion and the contact portion, the contact portion being held in pressing contact with the free end face by an elastic force generated by the elastically deforming portion.

(12) A printing-agent replenishing device according to the above mode (11), wherein the cutting wire includes a transverse portion which traverses the opening in the face of the free end portion of the delivery nozzle and which includes the contact portion, and the engaging portion consists of a pair of opposite engaging end portions engageable with respective two engaging portions of the rotary member which are located at respective circumferential positions of the rotary member that are opposed to each other in a diametric direction of the rotary member, said cutting wire including a pair of connecting portions connecting said opposite engaging end portions and opposite ends of said transverse portion, such that said opposite engaging end portions and said opposite ends of said transverse portion are located at respective different positions as viewed in a circumferential direction of said delivery nozzle, each of said pair of connecting portions including at least said elastically deforming portion.

The "pair of connecting portions which connect the opposite engaging end portions and opposite ends of the transverse portion" indicated above are preferably formed so as to be held in contact with the outer circumferential surface of the rotary member. These connecting portions may be shaped to helically extend in a direction having both a circumferential component and an axial component along the outer circumferential surface of the rotary member, before the cutting wire is attached to the rotary member. Alternatively, the connecting portions before the cutting wire is attached to the rotary member may include at least a portion which extends in only the circumferential direction of the rotary member. In the latter case, each connecting portion may consist of a portion which extends in only the circumferential direction of the rotary member, or may alternatively consists of a portion which extends in the circumferential direction of the rotary member and a portion which extends in the axial direction.

In any case, each connecting portion includes at least the elastically deforming portion an elastic force of which is utilized to hold the contact portion of the transverse portion in pressing contact with the free end face of the delivery nozzle.

In the printing-agent replenishing device according to the above mode (12), it is essential that the elastically deforming portion be elastically deformed when the rotary member with the cutting wire attached thereto is mounted on the replenisher. Before the rotary member with the cutting wire attached thereto is mounted on the replenisher, the elastically deforming portion may or may not be placed in an elastically deformed state. Where each of the connecting portions connecting the respective opposite engaging end portions and the respective opposite ends of the transverse portion consists of the elastically deforming portion which extends in the circumferential direction of the rotary member, the elastically deforming portion is elastically deformed in the axial direction when the cutting wire is attached to the rotary member. Accordingly, the elastically deforming portion attached to the rotary member extends helically along the outer circumferential surface of the rotary member. When the rotary member is mounted on the delivery nozzle of the replenisher, the elastically deforming portion is further elastically deformed in the axial direction, so that the contact portion of the transverse portion is held in pressing contact with the free end face of the nozzle under the elastic force of the elastically deforming portion. Described in detail, the rotary member is mounted on the delivery nozzle such that the end face of the rotary member corresponding to the free end face of the nozzle is spaced a suitable distance from the end face of the nozzle in the axial direction of the nozzle toward the fixed end of the nozzle, for example. In this case, the amount of elastic deformation of the elastically deforming portion is increased by an axial movement of the rotary member relative to the delivery nozzle during mounting of the rotary member on the nozzle. Before the rotary member is mounted on the delivery nozzle, a part of the transverse portion is in contact with the end face of the rotary member as well as the free end face of the nozzle. When the rotary member is mounted on the nozzle with an axial movement of the rotary member, the above-indicated part of the transverse portion is separated from the end face of the rotary member while the adjacent part of the transverse portion remains in contact with the free end face of the nozzle. Accordingly, the amount of elastic deformation of the elastically deforming portion is increased when the rotary member has been mounted on the nozzle such that the end face of the rotary member is spaced from the free end face of the nozzle.

The rotary member may be mounted on the delivery nozzle as described above, also where each connecting portion connecting the corresponding engaging end portion of the cutting wire and the corresponding end of the transverse portion consists of the elastically deforming portion extending in the circumferential direction of the rotary member and a portion extending the axial direction, or where each connecting portion consists of the elastically deforming portion helically extending in the circumferential and axial directions of the rotary member. In these cases, however, the elastically deforming portion is not elastically deformed when the cutting wire is attached to the rotary member, but is elastically deformed when the rotary member with the cutting wire attached thereto is mounted on the delivery nozzle so that the contact portions are held in pressing contact with the free end face of the nozzle.

(13) A printing-agent replenishing device according to any one of the above modes (2)–(12), wherein the rotary member is a sleeve rotatably mounted on an outer circumferential surface of a free end portion of the delivery nozzle which has the above-indicated opening.

(14) A printing-agent replenishing device according to the above mode (13), wherein the outer circumferential surface of the free end portion of the delivery nozzle has an annular groove, and the sleeve has a plurality of through-holes formed through a cylindrical wall thereof in a radial direction thereof such that the through-holes are spaced from each other in a circumferential direction of the cylindrical wall, the replenisher being provided with a generally C-shaped elastic ring which includes a plurality of engaging projections which extend in a radially inward direction thereof and which are fitted on an outer circumferential surface of the sleeve such that said engaging projections extend through the through-holes, respectively, and are fitted at radially inward ends in the annular groove.

The elastic ring whose engaging projections are fitted at their radially inward ends in the annular groove of the delivery nozzle is rotatable relative to the nozzle, but is not substantially axially movable relative to the nozzle. Since the engaging projections extend through the through-holes formed through the cylindrical wall of the sleeve, the sleeve is not substantially axially movable relative to the elastic ring, so that the sleeve mounted on the delivery nozzle is rotatable and axially immovable relative to the delivery nozzle.

(15) A printing-agent replenishing device according to the above mode (14), wherein the plurality of engaging projections of the generally C-shaped elastic ring consist of two arcuate engaging projections which are formed at two mutually diametrically opposed circumferential positions of the elastic ring and which have an arcuate shape partly defined by a circumference of the elastic ring, the plurality of through-holes of the sleeve consisting of two arcuate slots which are formed at two mutually diametrically opposed circumferential positions of the sleeve and through which the two arcuate engaging projections extend for engagement with the annular groove.

Each of the arcuate engaging portions of the elastic ring is partly defined by the circumference of the elastic ring and partly defined by a chord. Each arcuate engaging portion is fitted in the annular groove, at a part adjacent to an intermediate portion of the chord. The arcuate slots of the sleeve can be easily formed by removing two diametrically opposed circumferential portions of the cylindrical wall of the sleeve, by cutting in a plane perpendicular to the axis of the sleeve, along two parallel straight lines in the tangential direction of the cylindrical wall.

(16) A printing-agent replenishing device according to the above mode (14) or (15), wherein the cutting wire includes a pair of engaging portions engageable with respective two engaging portions formed in the outer circumferential surface of the sleeve, and the replenisher being provided with a substantially cylindrical retainer ring which has a radially inward flange at one axial end thereof and which is fitted on the outer circumferential surface of the sleeve such that the retainer ring is axially movable relative to the sleeve and such that the retainer ring covers the pair of engaging portions of the cutting wire in engagement with the two engaging portions, while the radially inward flange is sandwiched between the elastic ring and portions of the cutting wire adjacent the pair of engaging portions.

The engaging portions formed in the outer circumferential surface of the sleeve may be through-holes formed through the cylindrical wall of the sleeve or recesses formed in the outer circumferential surface.

According to the above mode (16), the elastic ring functions to hold the retainer ring so that the retainer ring functions to prevent removal of the engaging portions of the cutting wire from the engaging portions of the sleeve.

(17) A printing-agent replenishing device according to any one of the above modes (1)–(16), further comprising:
a holding member which holds the replenisher;
a bracket which holds the holding member such that the holding member is vertically movable; and
an elevator device interposed between the holding member and the bracket and operable to move said holding member in an almost vertical direction between a printing-agent-replenishing position in which the printing-agent replenishment object is replenished with the printing agent by the replenisher, and a retracted position which is located above the printing-agent-replenishing position.

(18) A printing-agent replenishing device according to any one of the above modes (1)–(17), further comprising:
a holding member which holds the replenisher;
a bracket which holds the holding member such that the holding member is pivotable about a pivot axis extending in a substantially horizontal direction; and
an attitude-changing device operable to pivot the holding member about the pivot axis, for thereby changing an attitude of the replenisher to a selected one of at least two attitudes including a printing-agent-replenishing attitude in which the delivery nozzle extends generally downwards, and a standby attitude in which the a longitudinal direction of the delivery nozzle is closer to a horizontal direction than when the replenisher is in the printing-agent-replenishing attitude.

For instance, the attitude-changing device includes a cam and a cam follower which comes into contact with each other to pivot the holding member for thereby changing the attitude of the replenisher, when the holding member is substantially vertically moved. In this case, the holding member is pivoted utilizing the movement of the holding member. Alternatively, the attitude-changing device may include an exclusive drive source, for example, a motor such as an electric motor, or a fluid-operated actuator such as a rotary air cylinder, which is operated to pivot the holding member.

The longitudinal direction of the delivery nozzle which is "closer to a horizontal direction than when the replenisher is in the printing-agent-replenishing attitude" may be completely parallel to the horizontal direction, or inclined with respect to the horizontal direction but relatively close to the horizontal direction. Where the longitudinal direction of the delivery nozzle is relatively close to the horizontal direction when the replenisher is in the standby attitude, the level or depth of a mass of the printing agent accommodated in the container is relatively low, reducing the pressure which acts on a mass of the printing agent in a bottom portion of the container near the delivery nozzle, due to the own weight of the printing agent. This arrangement is effective to prevent drooping or dropping of the printing agent from the opening at the free end of the delivery nozzle, making it possible to avoid wasting of the printing agent, and contamination of the components located below the delivery nozzle, with the printing agent which has dropped from the free end of the nozzle. The replenisher is held in the standby attitude while the printing-agent replenishment object is not replenished with the printing agent, for instance, while the printing agent is printed on the workpiece. Thus, the replenisher is normally placed in the standby attitude, without a risk of the problems such as the dropping of the printing agent from the delivery nozzle.

The time during which the replenisher is held in the standby attitude is usually considerably longer than the time during which the replenisher is placed in the printing-agent-replenishing attitude. While the screen printer is held at rest or while its screen printing operation is suspended, the replenisher is generally kept in the standby attitude. In this respect, the attitude-changing device is desirably arranged to hold the replenisher in the standby attitude, without consumption of an energy in the form of an electric current or a pressurized fluid by a drive source, and to establish the printing-agent-replenishing attitude with the drive source activated with an energy.

(19) A printing-agent replenishing device according to any one of the above modes (1)–(18), further comprising:

a movable member which holds the replenisher and which is movable in a horizontal direction; and a movable-member drive device operable to move the movable member.

When the printing-agent replenishment object is replenished with the printing agent by the replenisher, the movable member holding the replenisher is horizontally moved to move the replenisher along the printing-agent replenishment object.

(20) A printing-agent replenishing device according to any one of the above modes (1)–(19), further comprising:

a holding member which holds the replenisher;

a first bracket which holds the holding member such that the holding member is pivotable about a pivot axis extending in a substantially horizontal direction;

a second bracket which holds the first bracket such that the first bracket is movable in a substantially vertical direction;

an elevator device interposed between the first and second brackets and operable to move the holding member in an almost vertical direction between a printing-agent-replenishing position in which the printing-agent replenishment object is replenished with the printing agent by the replenisher, and a retracted position which is located above the printing-agent-replenishing position;

a cam disposed at a standby position spaced apart from the printing-agent replenishment object in a horizontal direction;

a cam follower disposed on the holding member; and a horizontal drive device operable to move the second bracket to the standby position in which the cam follower is engageable with the cam;

and wherein the cam is shaped such that a vertical motion of the first bracket when the second bracket is located at the standby position is converted, by engagement of the cam and the cam follower with each other during the vertical movement, into a pivotal motion of the holding member to establish a substantially horizontal posture of the replenisher.

According to the above mode (20), the printing-agent replenishment object is replenished with the printing agent by the replenisher while the replenisher is horizontally moved by a horizontal movement of the second bracket after the replenisher has been located at its printing-agent-replenishing position with a downward movement of the first bracket, for instance. After the object is replenished with the printing agent, the first bracket is moved upwards away from the object, to return the replenisher to its retracted position, and the second bracket is returned to the standby position. Then, the first bracket is moved upwards or downwards to pivot the holding member for thereby pivoting the replenisher to establish the substantially horizontal posture, so that the replenisher is placed in its standby attitude ready for the next replenishing operation. Thus, the holding member is pivoted by utilizing the horizontal motion of the second bracket and the vertical movement of the first bracket, to change the attitude of the replenisher. In other words, an attitude-changing device to change the attitude of the replenisher does not use an exclusive drive source, and is accordingly available at a lower cost than an attitude-changing device which uses an exclusive drive source.

According to the above mode (20), the elevator device cooperates with the cam and the cam follower to constitute the attitude-changing device operable to change the attitude of the replenisher. Since the attitude-changing device is desirably arranged to hold the replenisher in the standby attitude without consumption of an energy, as described above, it is desirable arrange the elevator device for holding the first bracket in the uppermost or lowermost position without consumption of an energy.

(21) A printing-agent replenishing device according to any one of the above modes (1)–(20), further comprising a delivery control device operable to control a pressure in an upper space within the container of the replenisher, for thereby controlling a delivery of the printing agent from the container through the delivery nozzle.

(22) A printing-agent replenishing device according to the above mode (21), wherein the delivery control device includes: a positive pressure source; a negative pressure source; and a directional control valve device operable to effect selective communication of the upper space of the container with one of the positive and negative pressure sources.

When the upper space within the container of the replenisher is in communication with the positive pressure source, a positive pressure in the upper space acts on a mass of the printing agent, so that the printing agent can be delivered through the delivery nozzle. When the upper space is in communication with the negative pressure source, a pressure which acts on a mass of the printing agent adjacent to the delivery nozzle, due to the weight of the printing agent itself, is made to be almost equal to the atmospheric pressure, so that the delivery of the printing agent through the nozzle is terminated, or alternatively made to be negative, so that a mass of the printing agent in the free end portion of the delivery nozzle is sucked toward the container. In the latter case, the components located below the delivery nozzle are effectively protected from undesirable contamination with the mass of the printing agent which is left near the opening of the free end of the nozzle after the cutting-off operation by the cutting wire and which has dropped down from the free end.

(23) A printing-agent replenishing device according to the above mode (22), wherein the directional control valve device is operable to selectively establish a pressurizing state in which the upper space is in communication with the positive pressure source, a sucking state in which the upper space is in communication with the negative pressure source, and a neutral state in which the upper space is in communication with the atmosphere.

According to the above mode (23), the printing agent can be cut off while the upper space in the container of the replenisher is at the atmospheric pressure, as in the mode (24) described below, with the upper space in communication with the atmosphere. The upper space may be held at the atmospheric pressure while the replenisher is held in the standby state ready for the replenishing operation. In this case, it is possible to prevent undesirable drooping or dropping of the printing agent from the free end of the delivery nozzle due to a positive pressure in the upper space, or undesirable excessive suction of the printing agent into the delivery nozzle due to a negative pressure in the upper space, which would cause delayed initiation of delivery of the printing agent or an insufficient amount of delivery of the printing agent upon the next operation of the replenisher.

(24) A printing-agent replenishing device according to any one of the above modes (2)–(20), further comprising:

a delivery control device operable to selectively establish a positive pressure, an atmospheric pressure and a negative pressure in an upper space within the container of the replenisher, for thereby controlling a delivery of the printing agent from the container through the delivery nozzle;

a rotary drive device operable to rotate the rotary member; and a main control device connected to the delivery control device and the rotary drive device, and operable to control the delivery control device and the rotary drive device such that the upper space is held at the positive pressure to replenish the printing-agent replenishment object with the printing agent, such that the rotary drive device is operated to rotate the rotary member after the upper space has been held at the atmospheric pressure for a predetermined first time, and such that the rotary drive device is again operated to again rotate the rotary member after the upper space has been held at the negative pressure for a predetermined second time.

The technical feature according to the above mode (22) or (23) is applicable to the above mode (24). The predetermined first and second times indicated above may or may not be the same.

According to the above mode (24), the printing agent can be cut off by the cutting wire while the printing agent is held in a stationary state, without being pushed or sucked by the positive or negative pressure in the upper space of the container. Accordingly, the present arrangement is effective to prevent delivery of the printing agent through the delivery nozzle during the cutting-off operation by the cutting wire, which delivery would cause insufficient cutting of the printing agent. The present arrangement is also effective to prevent a movement of the printing agent from the printing-agent replenishment object back into the delivery nozzle during the cutting-off operation, which movement would cause an insufficient amount of delivery of the printing agent into the object. As described above, the printing agent is cut off by the cutting wire two times, with the second cutting-off operation being effected after the upper space in the container has been held at the negative pressure, so that the second cutting-off operation is initiated only after the delivery of the printing agent through the nozzle is completely terminated, or while the printing agent is slightly sucked back into the free end portion of the nozzle. Accordingly, the two cutting-off operations assure complete prevention of the printing agent from remaining near the opening of the free end of the nozzle or drooping or dropping down from the free end.

(25) A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:

a holding member which holds the replenisher;

a bracket which holds the holding member such that the holding member is pivotable about a pivot axis extending in a substantially horizontal direction; and an attitude-changing device operable to pivot the holding member about the pivot axis, for thereby changing an attitude of the replenisher to a selected one of at least two attitudes including a printing-agent-replenishing attitude in which the delivery nozzle extends generally downwards, and a standby attitude in which the a longitudinal direction of the delivery nozzle is closer to a horizontal direction than when the replenisher is in the printing-agent-replenishing attitude.

The printing-agent replenishing device according to the above mode (25) does not suffer from drooping or dropping of the printing agent from the delivery nozzle due to its own weight while the replenisher is placed in its standby attitude in which the delivery nozzle extends in an almost horizontal direction. Accordingly, the device does not suffer from consequent wasting of the printing agent and consequent contamination of the components located below the delivery nozzle, with the dropped printing agent.

(26) A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:

a holding member which holds the replenisher;

a first bracket which holds the holding member such that the holding member is pivotable about a pivot axis extending in a substantially horizontal direction;

a second bracket which holds the first bracket such that the first bracket is movable in a substantially vertical direction;

an elevator device interposed between the first and second brackets and operable to move the holding member in an almost vertical direction between a printing-agent-replenishing position in which the printing-agent replenishment object is replenished with the printing agent by the replenisher, and a retracted position which is located above the printing-agent-replenishing position;

a cam disposed at a standby position spaced apart from the printing-agent replenishment object in a horizontal direction;

a cam follower disposed on the holding member; and a horizontal drive device operable to move the second bracket to the standby position in which the cam follower is engageable with the cam;

and wherein the cam is shaped such that a vertical motion of the first bracket when the second bracket is located at the standby position is converted, by engagement of the cam and the cam follower with each other during the vertical movement, into a pivotal motion of the holding member to establish a substantially horizontal posture of the replenisher.

According to the above mode (26), the vertical motion of the first bracket is utilized to pivot the holding member to change the attitude of the replenisher. Thus, an attitude-changing device for changing the attitude of the replenisher does not use an exclusive drive source, and is accordingly available at a relatively low cost.

(27) A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:

a holding member which holds the replenisher;

a bracket which holds the holding member such that the holding member is pivotable about a pivot axis extending in a substantially horizontal direction;

a cam disposed at a standby position spaced apart from the printing-agent replenishment object in a horizontal direction;

a cam follower disposed on the holding member; and a horizontal drive device operable to move the bracket to the standby position in which the cam follower is engageable with the cam, and wherein the cam is shaped such that a horizontal motion of the bracket from a position near the standby position to the standby position is converted, by engagement of the cam and the cam follower with each other during the horizontal movement, into a pivotal motion of the holding member to establish a substantially horizontal posture of the replenisher.

According to the above mode (27), the holding member is horizontally moved by the horizontal movement of the bracket, to move the replenisher along the printing-agent replenishment object, for replenishing the object with the printing agent. Further, the horizontal movement of the bracket is utilized to pivot the holding member for thereby changing the attitude of the replenisher.

(28) A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:

a holding member which holds the replenisher;

a first bracket which holds the holding member such that the holding member is pivotable about a pivot axis extending in a substantially horizontal direction;

a second bracket which holds the first bracket such that the first bracket is movable in a substantially vertical direction;

an elevator device interposed between the first and second brackets and operable to move the holding member in an almost vertical direction to a selected one of a printing-agent-replenishing position in which the printing-agent replenishment object is replenished with the printing agent by the replenisher, a retracted position which is located above the printing-agent-replenishing position, and an attitude-changing position which is located below the printing-agent-replenishing position or above the retracted position; and an attitude-changing device operable to convert a motion of the first bracket to the attitude-changing position into a pivotal motion of the holding member, for thereby changing an attitude of the replenisher from a printing-agent-replenishing attitude in which the delivery nozzle extends generally downwards, to a standby attitude in which the a longitudinal direction of the delivery nozzle is closer to a horizontal direction than when the replenisher is in the printing-agent-replenishing attitude.

According to the above mode (28), the vertical motion of the first bracket to the attitude-changing portion is utilized to pivot the holding member for thereby changing the attitude of the replenisher. This changing of the attitude takes place when the first bracket is vertically moved from the retracted position to the attitude-changing position located above the retracted position, or from the printing-agent-replenishing position to the attitude-changing position located below the printing-agent-replenishing position.

The printing-agent replenishing device according to the above mode (28) may further include a horizontal drive device operable to move the second bracket in the horizontal direction to move the replenisher in the horizontal direction. Further, the present device may include a cutting wire attached to the replenisher, as in the device according to the above mode (1) or (2) of this invention, so that the printing agent is cut off by rotating the cutting wire about the axis of the delivery nozzle, after the printing-agent replenishment object is replenished with the printing agent by the replenisher.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
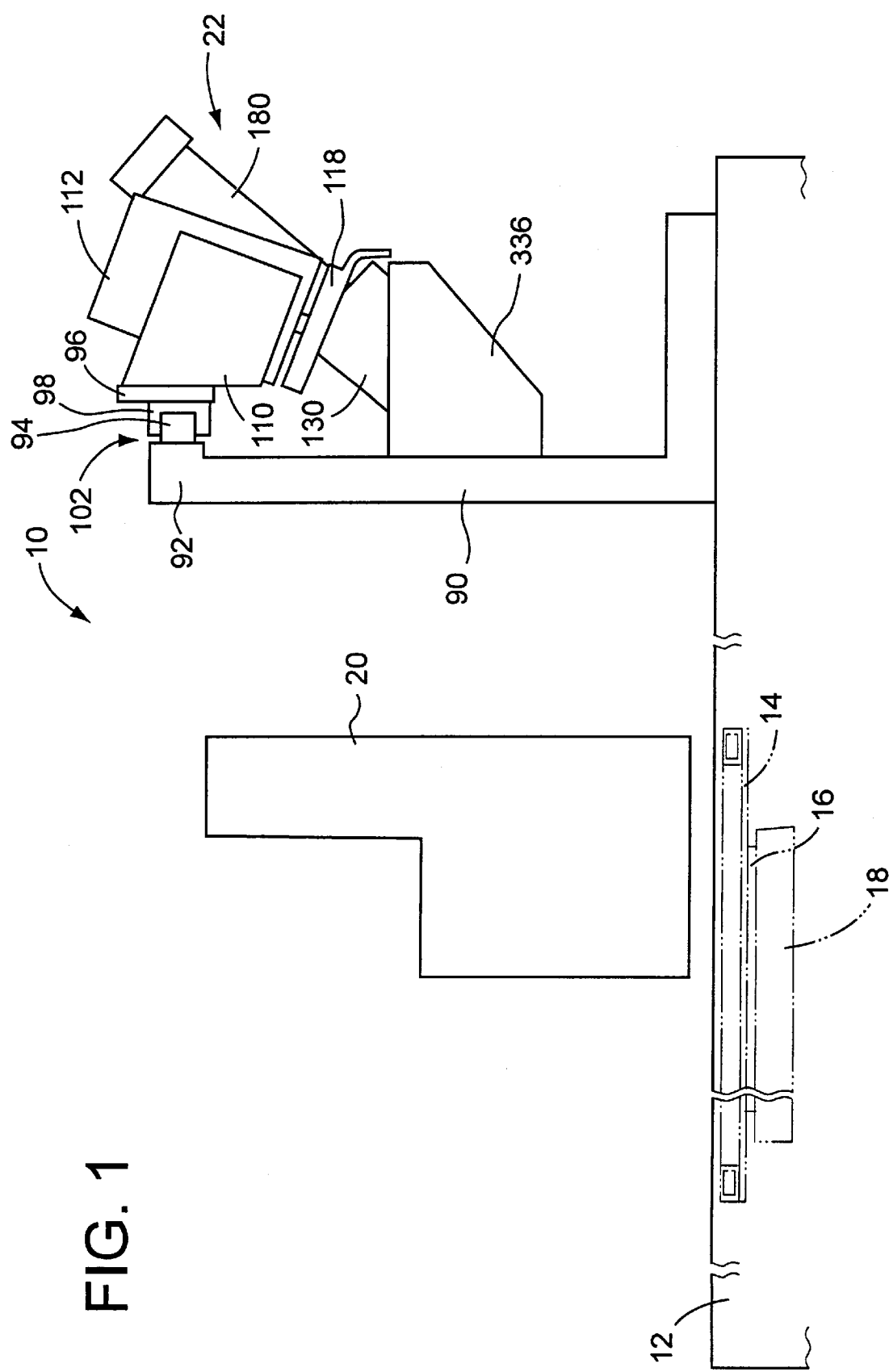
FIG. 1 is a front elevational view schematically showing a screen printer provided with a solder replenishing device constructed according to one embodiment of the present invention.

Referring to first to FIG. 1, reference sign 10 denotes a screen printer. On a machine base 12 of the screen printer 10, there are mounted: a screen fixing device (not shown) for positioning a printing screen or stencil 14 relative to the base 12 and fixing the screen 14 on the base 12; a printed-wiring-board supporting and positioning device 18 for supporting and positioning a circuit substrate as a workpiece in the form of a printed-wiring board 16; a printing-agent printing device in the form of a solder-paste printing device 20 (hereinafter referred to as "solder printing device 20") operable to print a highly viscous fluid as a printing agent in the form of a solder paste (solder cream) on the printed-wiring board 16; and a solder-paste replenishing device 22 (hereinafter referred to as "solder replenishing device 22") operable to replenish the solder printing device 20 with the solder paste. The printed-wiring-board supporting and positioning device 18 supports and position the printed-wiring board 16 received from a board transferring device (not shown), such that the printed-wiring board 16 is movable between an upper position in which the board 16 is in contact with the screen 14, and a lower position in which the board 16 is spaced apart from the screen 14.

Figure 2:
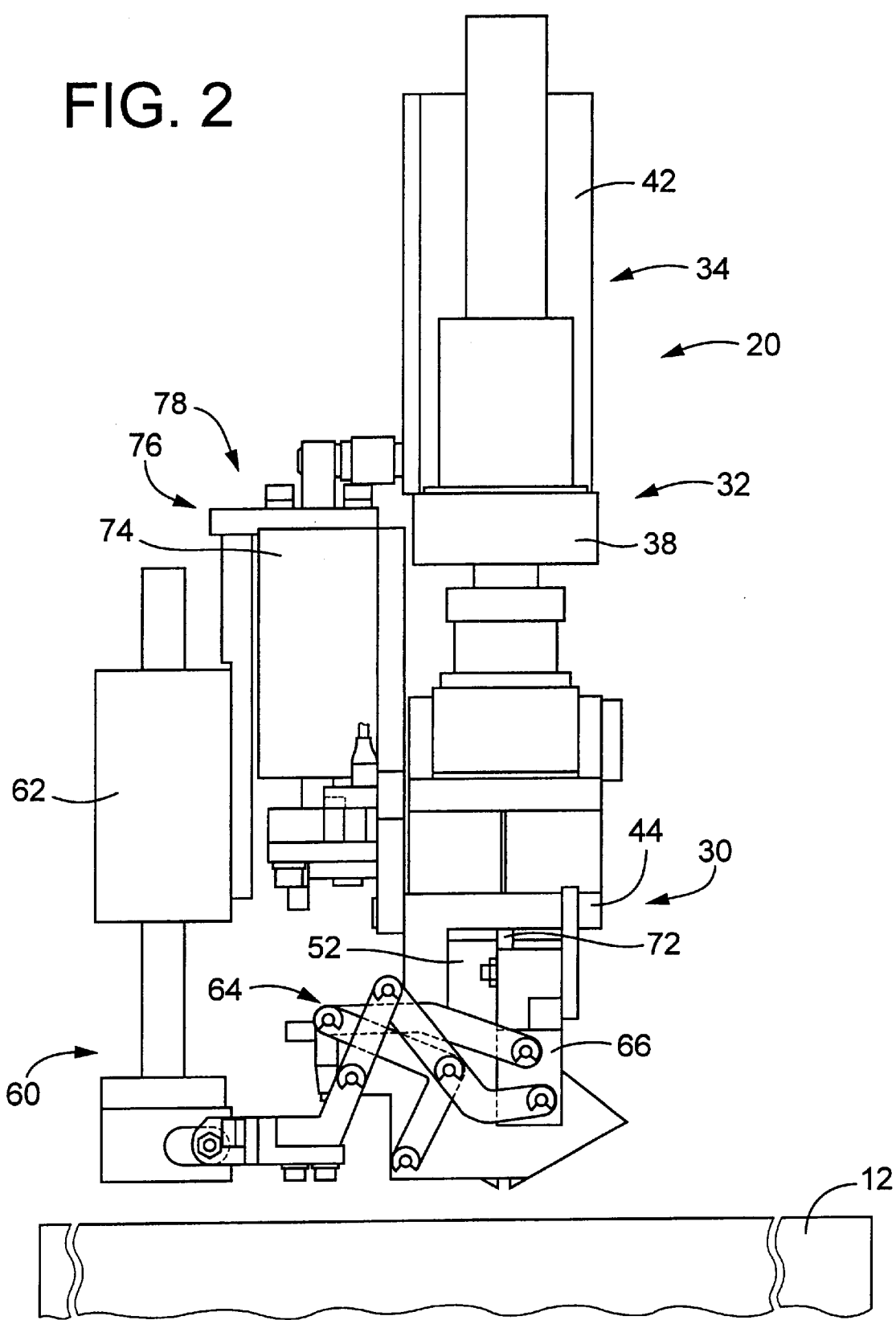
FIG. 2 is a front elevational view showing a solder printing device which is a part of the screen printer of FIG. 1.

The solder printing device 20, which is similar in construction to a solder printing device as disclosed in JP-A-8-48024, will be briefly described. The present solder printing device 20 is a solder printer of a type including a solder container having a sealed space for accommodating the solder paste, and an extruder for extruding the solder paste from the solder container, for applying the solder paste onto the printed-wiring board 16 through a mesh of the printing screen 14. As shown in FIG. 2, the solder printing device 20 is provided with a printing head in the form of a pressure-coating head 30, a head moving device 32 operable to move the pressure-coating head 30 in a horizontal plane, and a head elevating and lowering device 34 operable to vertically move the head 30.

The head moving device 32 includes a movable member 38 supported movably in the horizontal direction parallel to the screen 14. The movable member 38 is moved in parallel with the screen 14, by a movable-member moving device including an electric motor serving as a drive source in the form of a servomotor 40 indicated in FIG. 16. The servomotor 40 is an electric motor the operating amount or angle of which can be controlled with high accuracy. The servomotor 40 may be replaced by a stepping motor. This is also true for other servomotors used in the present embodiment, which will be described.

The pressure-coating device 30 and the head elevating and lowering device 34 are mounted on the movable member 38. For example, the head elevating and lowering device 34 uses an air cylinder 42 as a drive source, and includes an elevator member 44 which is vertically moved by the air cylinder 42, so that the pressure-coating head 30 mounted on the elevator member 44 is moved by toward and away from the screen 14. Thus, the head elevating and lowering device 34 serves as a device operable to move the pressure-coating head 30 and the printing screen 14 toward and away from each other, and cooperates with the head moving device 32 to constitute a relative-movement device operable to move the head 30 and the screen 14 in the horizontal direction parallel with the screen 14 and the vertical direction perpendicular to the screen 14. The air cylinder 42 is a kind of a fluid-operated cylinder, which is a fluid-operated actuator. This is also true for other air cylinders used in the present embodiment, which will be described.

Figure 3:
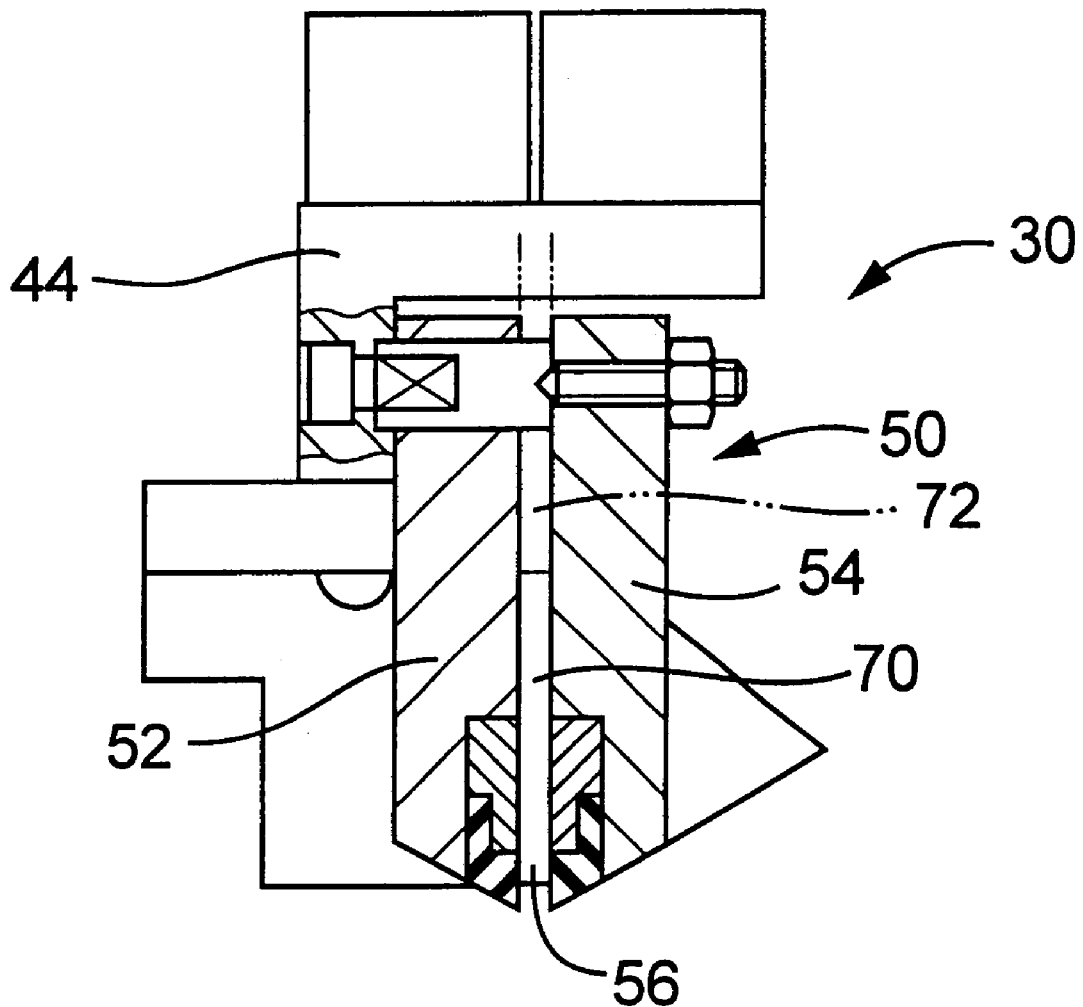
FIG. 3 is a front elevational view partly in cross section showing a pressure-coating head of the solder printing device.

As shown in FIG. 3, the pressure-coating head 30 has a printing-agent dispenser in the form of a solder dispenser 50, which is elongate in a direction parallel to the direction of width of the screen 14, and consists of a plurality of members assembled together. In the present embodiment, the solder dispenser 50 includes a first member 52, a second member 54 and a pair of closure plates 56, which are all planar members. The first member 52 is fixed to the elevator member 44, while the second member 54 is disposed pivotably about an axis parallel to the direction of width of the screen 14. The second member 54 is pivoted by a pivoting device 60 mounted on the elevator member 44. The pivoting device 60 includes an air cylinder 62 as a drive source, and a motion-transmitting device 64 including a plurality of links, and a pivotable member 66 to which a vertical movement of the air cylinder 62 is transmitted through the motion-transmitting device 64. The second member 54 is connected to the pivotable member 66, and is pivoted with the pivotable member 66 when the pivotable member 66 is pivoted.

As shown in FIG. 3, the second member 54 is spaced apart from the first member 52 by a suitable distance, so that the first and second members 52, 54 define a gap which is elongate in the direction parallel to the width of the screen 14. The second member 54 is pivotable between a closed position and an open position. In the closed position of the second member 54, the above-indicated gap is closed at its ends opposite to each other in the longitudinal direction, by a pair of closure plates 56, whereby a solder-accommodating chamber 70 is defined by the first and second members 52, 54 and the closure plates 56. In the open position of the second member 54 shown in FIG. 4, the solder-accommodating chamber 70 is opened so that the chamber 70 is replenished with the solder paste. In this sense, the open position of the second member 54 may be referred to as a "solder-replenishing position".

An extruding member 72 is vertically movably disposed in the solder-accommodating chamber 70, and is vertically moved by an extruder drive device 76 including an air cylinder 74 as a drive source. The extruding member 72 is elongate in the longitudinal direction of the solder dispenser 50. When the extruding member 72 is lowered, the solder paste accommodated in the solder-accommodating chamber 70 is extruded therefrom, and is applied to the printed-wiring board 16 through the screen 14. In the present embodiment, the extruding member 72 and the extruder drive device 76 cooperate to constitute a printing-agent extruding device in the form of a solder extruding device 78, while the solder dispenser 50 provides a printing-agent dispenser of the screen printer 10, which is a printing-agent replenishment object in the form of a solder replenishment object that is to be replenished with a printing agent by the printing-agent replenishing device in the form of the solder replenishing device 22.

There will be described the solder replenishing device 22. As shown in FIG. 1, the solder replenishing device 22 is mounted on an end portion of the machine base 12, which is spaced apart from a printing area corresponding to the screen 14, in a printing direction (in the right direction as seen in FIG. 1). Thus, the solder replenishing device 22 is located in a non-printing area of the machine base 12. A frame 90 is fixedly disposed in the non-printing area of the machine base 12 such that the frame 90 stands upright. This frame 90 is of generally portal type, including a horizontal beam portion 92. On a surface of the horizontal beam portion 92 which is remote from the solder printing device 20, there is provided a guiding member in the form of a guide rail 94 extending in a horizontal direction parallel to the direction of width of the screen 14 and the longitudinal direction of the solder dispenser 50. On the guide rail 94, there is slidably movably mounted a movable member in the form of a slide 96 through a guide block 98. In the present embodiment, the slide 96 is moved in the horizontal direction by a movable-member drive device including an air cylinder 100 (FIG. 16) as a drive source, while being guided by the guide rail 94. In the present embodiment, the slide 96 and the movable-member drive device including the air cylinder 100 constitute a horizontal drive device 102.

On the slide 96, there is removably mounted a bracket 110. With the slide 96 being moved by the movable-member drive device, the bracket 110 is moved in the horizontal direction parallel to the longitudinal direction of the solder dispenser 50. The bracket 110 is a planar member on which an air cylinder 112 is fixedly provided as a drive source. In the present embodiment, the air cylinder 112 is a double-acting cylinder the axis of which is inclined with respect to a vertical plane perpendicular to the screen 14, such that the axis approaches the solder printing device 20 as it extends downwards. The air cylinder 112 has a cylinder housing 116, and a piston rod 114 extending downwards from the cylinder housing 116, along the inclined axis of the air cylinder 112. To the lower free end of the piston rod 114, there is removably fixed a bracket 118. The bracket 118 and the bracket 110 indicated above will be referred to as "a first bracket 118" and "a second bracket 110", respectively. The first bracket 118 is moved generally vertically with a movement of the piston rod 114, that is, in the direction of extension of the inclined axis of the air cylinder 112.

A pair of guiding members in the form of a pair of guide rods 120 are fixed at their lower ends to the first bracket 118. These guide rods 120 engage the cylinder housing 116 such that the guide rods 120 are slidably axially movable in the direction of extension of the axis of the air cylinder 112. Thus, the first bracket 118 is vertically movably guided by the guide rods 120. The air cylinder 112 is disposed between the first bracket 118 and the second bracket 110 such that the second bracket 110 supports the first bracket 118 such that the first bracket 118 is movable in a substantially vertical direction. In the present embodiment, the air cylinder 112 constitutes a major part of an elevator device 122 by which the first bracket 118 is moved in the substantially vertical direction, while the second bracket 110 is moved by the horizontal drive device 102 in the horizontal direction.

Figure 6:
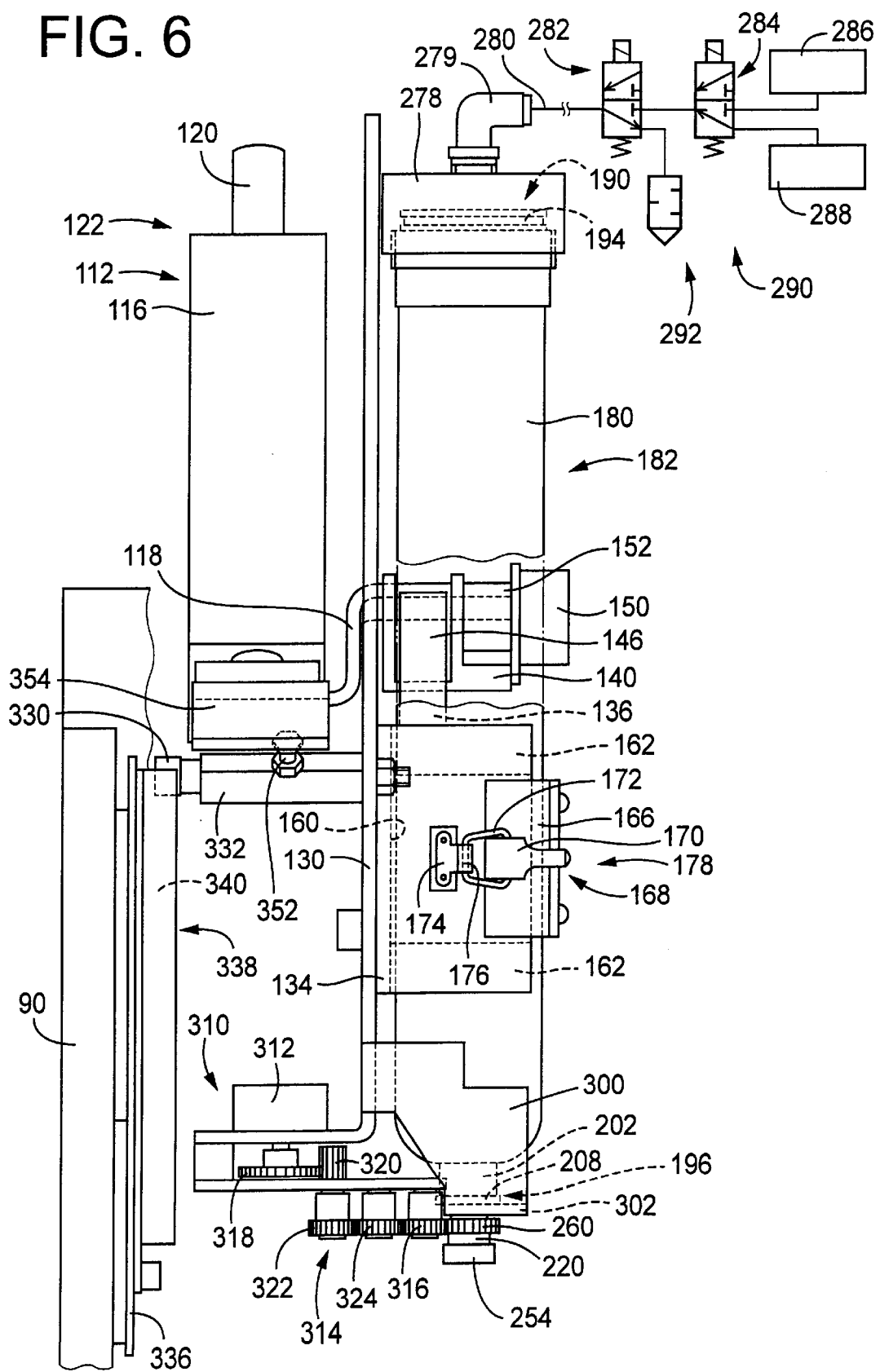
FIG. 6 is a right-side elevational view of the solder replenishing device.

As shown in FIG. 6, the first bracket 118 includes an extension laterally extending from a portion thereof engaging the piston rod 114. To a free end portion of this extension of the first bracket 118, there is pivotably fixed a holding member in the form of a holder plate 130. This holder plate 130 is a generally elongate member including a lower portion to which a block 134 is removably fixed. On this block 134, an engaging member 136 is removably fixed.

Figure 5:
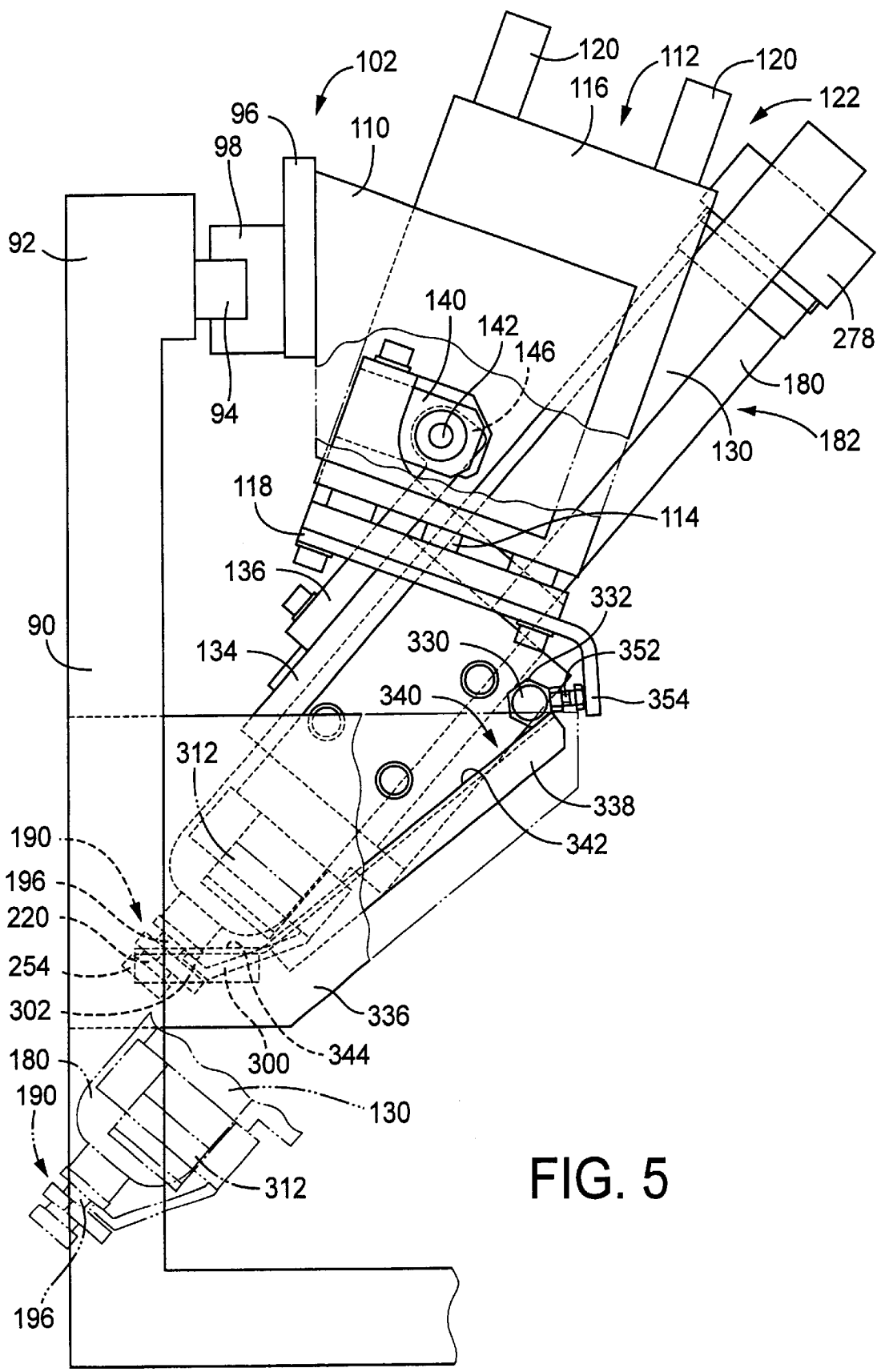
FIG. 5 is a front elevational view showing the solder replenishing device.
Figure 7:
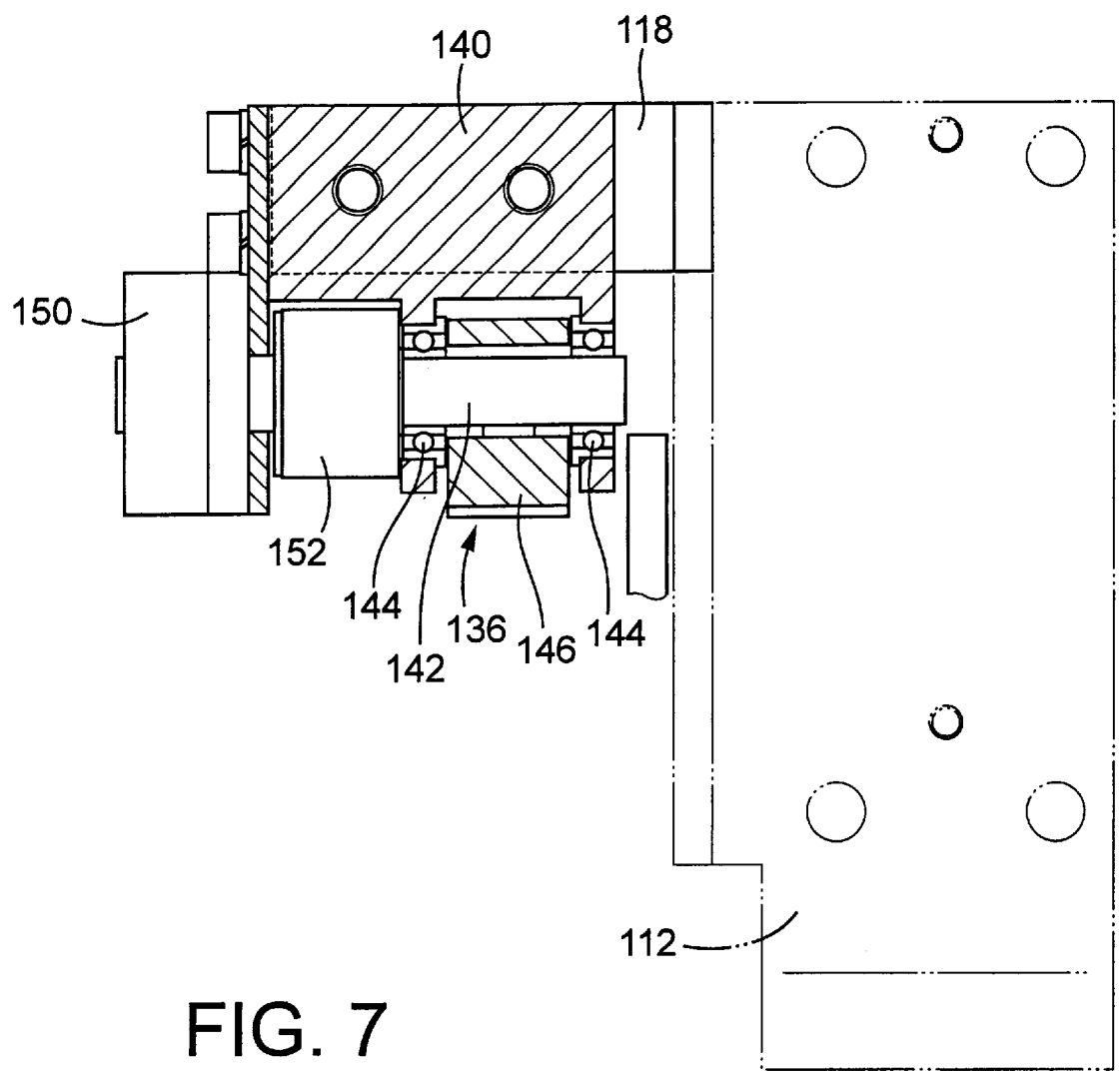
FIG. 7 is a bottom plan view (partly in cross section) showing an attitude-holding device for the replenisher of the solder replenishing device.

As shown in FIGS. 5 and 6, the engaging member 136 is a generally planar member extending upwards from the block 134. As shown in FIG. 7, a support member 140 in the form of a block is removably fixed on the first bracket 118, and a support shaft 142 is supported by the support member 140 via bearings 144 such that the support shaft 142 is rotatable about a horizontal axis parallel to the direction of movement of the second bracket 110 (slide 96). The engaging member 136 includes an end portion 146 fitted on the support shaft 142 such that the end portion 146 (engaging member 136) is not rotatable relative to the support shaft 142. In this arrangement, the holder plate 130 is pivotally supported by the first bracket 118, such that the holder plate 130 is pivotable with the support shaft 142.

To the support member 140, there is fixed a rotary actuator serving as a fluid-operated actuator in the form of a rotary air cylinder 150. A rotary motion of the rotary air cylinder 150 is transmitted to the support shaft 142 through a coupling member 152. That is, the rotary air cylinder 150 has two air chambers. When the two air chambers are communicated with a positive pressure source and a negative pressure source, respectively, the rotary air cylinder 150 is operated to apply a torque to the support shaft 142, and a force is applied to the holder plate 130 so that the holder plate 130 is pivoted about the horizontal axis of the support shaft 142.

Figure 8:
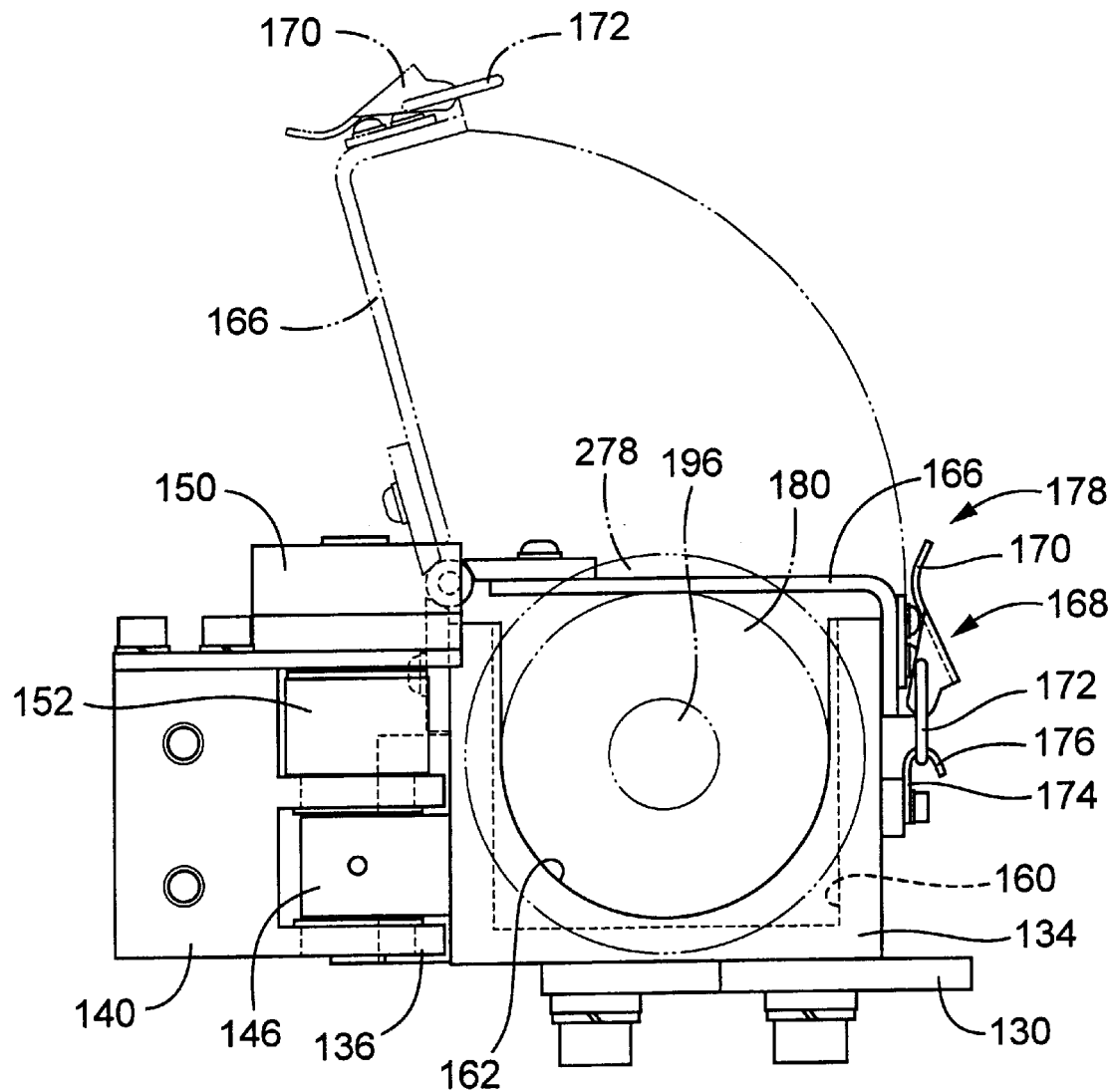
FIG. 8 is a plan view showing a mounting device for mounting a holder sleeve on a holder plate in the solder replenishing device.

The block 134 fixed to the holder plate 130 has a recessed portion 160 open in a surface there remote from the holder plate 130, as shown in FIGS. 6 and 8. The recessed portion 160 has a recess formed through the block 134 in the longitudinal direction of the holder plate 130. The recessed portion 160 has two positioning end portions 162 adjacent to its upper and lower ends, respectively. The positioning end portions 162 is U-shaped in transverse cross section.

The block 134 is provided with a door 166 pivotably fixed thereof. The door 166 is pivotable between an open position and a closed position about an axis parallel to the longitudinal direction of the holder plate 130. The door 166 is kept in its closed position by a latch 168, which includes an operating member 170 pivotably fixed to the door 166, an engaging member 172 in the form of a ring pivotably fixed to the operating member 170, and an engaging member 174 fixed to the block 134. In the present embodiment, the engaging member 174 is formed from a spring member and includes an engaging portion 176 that is U-shaped in cross section. When the operating member 170 is operated with its free end moved in a direction away from the engaging member 172 while the engaging member 172 is in engagement with the engaging portion 176 of the engaging member 174, the engaging member 172 is held in engagement with the engaging portion 176, where by the door 166 is locked in the closed position. In the closed position, the door 166 is spaced apart from the surface of the block 134 in which the recess of the recessed portion 160 is open. In the present embodiment, the block 134, door 166 and latch 168 constitute a major part of a fixing device 178.

Figure 9:
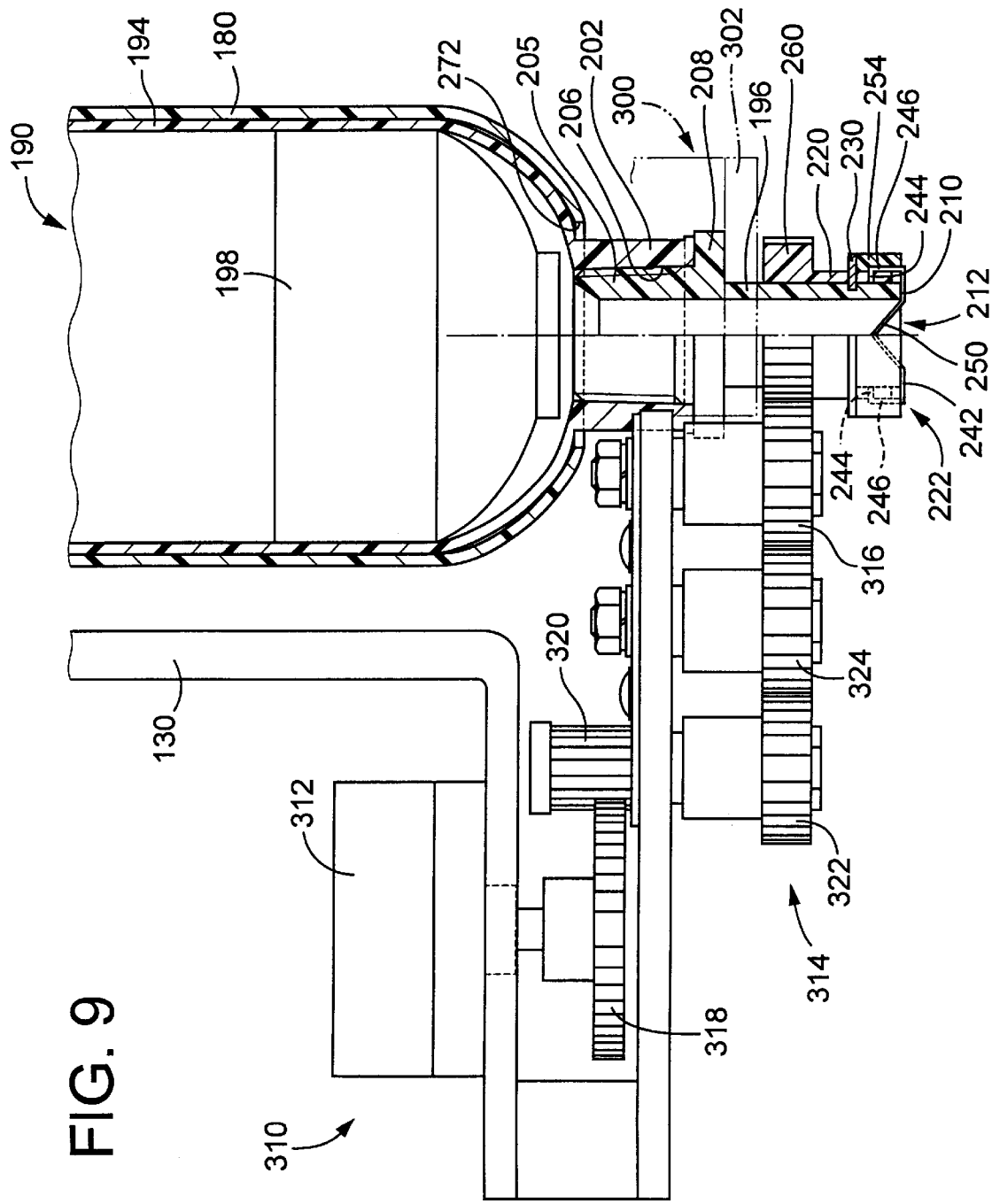
FIG. 9 is a side elevational view (partly in cross section) showing the replenisher, sleeve and rotary drive device in the solder replenishing device.

The fixing device 178 cooperates with a holder sleeve 180 shown in FIG. 6, to constitute a replenisher holding device 182 for removably holding a replenisher 190 of the solder replenishing device 22. The replenisher 190 includes a syringe 194 having a circular shape in cross section, and a delivery nozzle 196 provided at one end of the syringe 194. The syringe 194 accommodates the printing agent in the form of the solder paste or cream indicated above, and is provided with a float 198 substantially fluid-tightly fitted therein, as shown in FIG. 9. The float 198 is movable relative to the syringe 194 in the axial direction of the syringe 194.

The syringe 194 has relatively large axial length, and is provided with a cylindrical protruding portion 202 formed coaxially at one axial end thereof. The delivery nozzle 196 is removably fixed to the protruding portion 202. The delivery nozzle 196 has a generally cylindrical shape, and includes an externally threaded end portion 205 which engages an internal thread 206 formed in the inner circumferential surface of the protruding portion 202. The externally threaded end portion 205 of the delivery nozzle 196 and the internal thread 206 of the protruding portion 202 cooperate to constitute a mounting or fixing portion for removably mounting the delivery nozzle 196 to the syringe 194. The delivery nozzle 196 has a radially outwardly extending flange 208, which is provided for abutting contact with the end face of the protruding portion 202, to limit a maximum amount of axial relative movement of the delivery nozzle 196 and the protruding portion 202 toward each other by engagement of the externally threaded end portion 205 and the internal thread 206. When the delivery nozzle 196 is fixed to the protruding portion 202, the delivery nozzle 196 is manually rotated with a torque applied to its flange 208. It will be understood that the flange 208 not only cooperates with the protruding portion 202 to constitute a positioning means for positioning the delivery nozzle 196 and the protruding portion 202 relative to each other in the axial direction, but also functions as an operating portion at which the delivery nozzle 198 is operated when it is fixed to the protruding portion 202.

With the delivery nozzle 196 threaded to the protruding portion 202, the open end of the externally threaded end portion 205 is in communication with the interior of the syringe 194. The non-threaded end portion of the delivery nozzle 196 remote from the externally threaded end portion 205 has an end face 210 having an opening 212.

Figure 10:
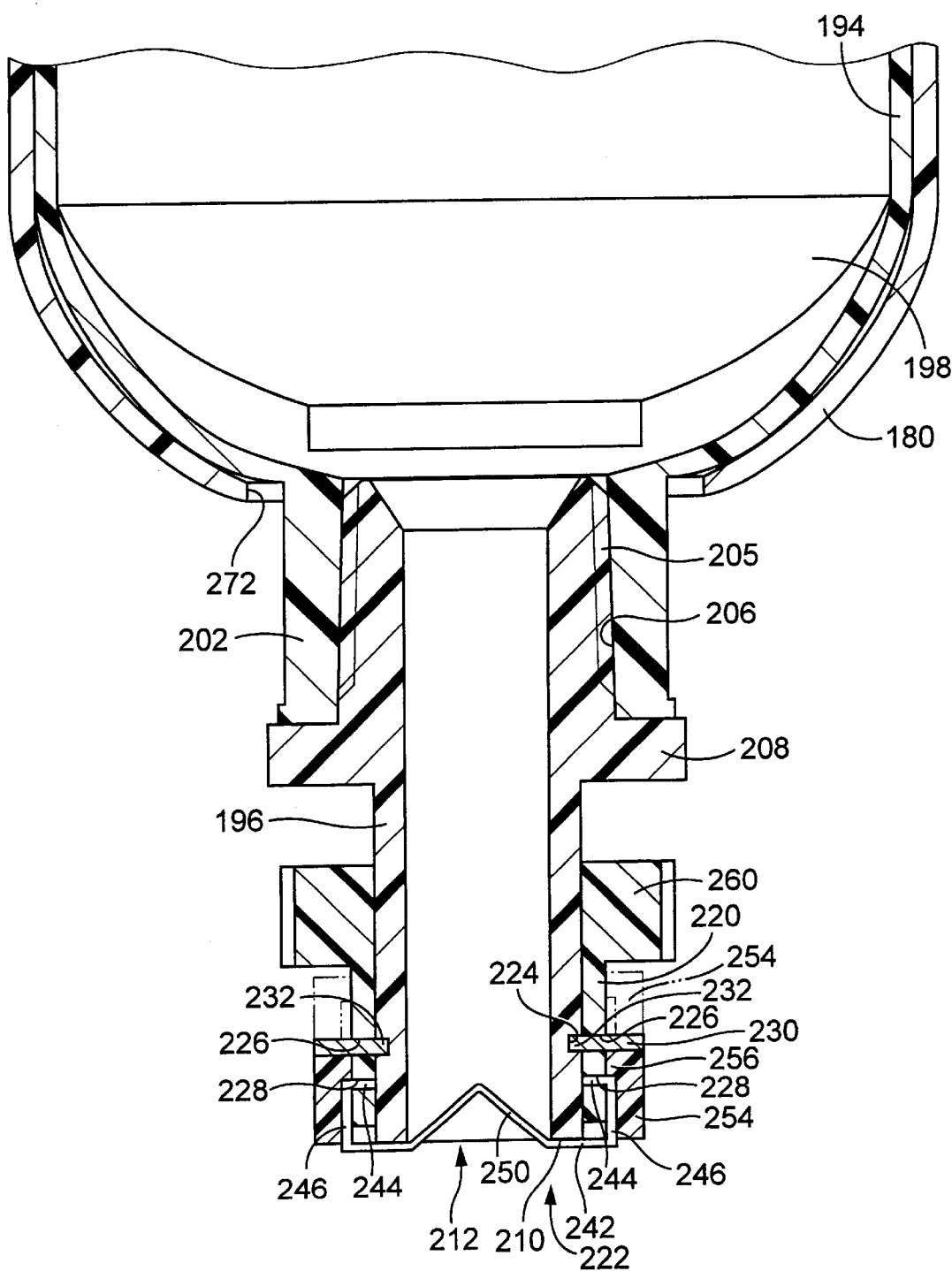
FIG. 10 is a side elevational view showing a delivery nozzle of the replenisher, which is provided with a cutting wire.

As shown in FIG. 10, the non-threaded end portion of the delivery nozzle 196 carries a rotary member in the form of a sleeve 220 removably fitted on its outer circumferential surface such that the sleeve 220 is rotatable relative to the delivery nozzle 196 about the axis of the delivery nozzle 196. The sleeve 220 is provided with a cutting wire 222 attached thereto. The non-threaded end portion of the delivery nozzle 196 has an annular groove 224 open in its outer circumferential surface.

Figure 11:
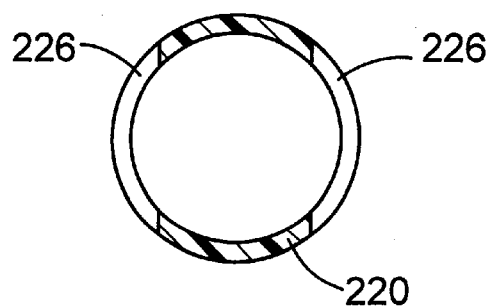
FIG. 11 is a plan view the sleeve in cross section taken at a portion having slits.

The sleeve 220 has a plurality of arcuate slots 226 formed through its cylindrical wall of an axially intermediate portion thereof, at respective circumferential positions of the wall. In this embodiment, two arcuate slots 226 are formed at respective two circumferential positions which are opposed to each other diametrically of the sleeve 220, as shown in FIG. 11. The arcuate slots 226 serve as through-holes formed through the cylindrical wall of the sleeve 220. A distance between the arcuate slots 226 and an end face of the sleeve 220 corresponding to the end face 210 of the delivery nozzle 196 is smaller than a distance between the annular groove 224 and the end face 210 of the delivery nozzle 196. As shown in FIG. 10, the sleeve 220 further has two through-holes 228 formed through the cylindrical wall of an axial portion thereof between the arcuate slots 226 and the above-indicated end face. The two through-holes 228, which are opposed to each other diametrically of the sleeve 220, serve as engaging holes for engagement with the cutting wire 222.

Figure 12:
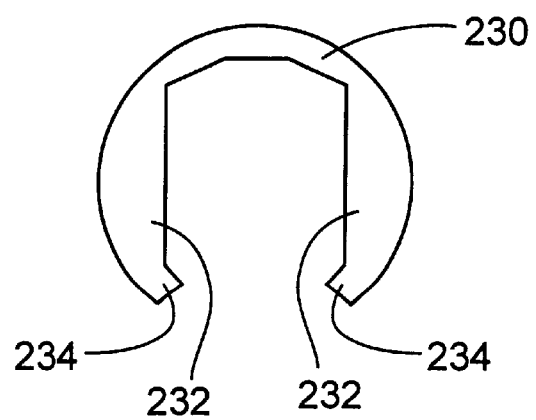
FIG. 12 is a plan view showing an elastic ring for mounting the sleeve on the delivery nozzle.

The sleeve 220 has an elastic ring 230 mounted thereof, as shown in FIG. 10, and is fitted on the delivery nozzle 196 via the elastic ring 230 such that the elastic ring 230 substantially prevents an axial movement of the sleeve 220 relative to the delivery nozzle 196, but permits a rotary movement of the sleeve 220 relative to the delivery nozzle 196. As shown in FIG. 12, the elastic ring 230 is a generally C-shaped member having two arcuate engaging projections 232 formed so as to extend radially inwardly from respective circumferential portions thereof that are diametrically opposed to each other. The two arcuate engaging projections 232 of the generally C-shaped elastic ring 230 have free ends 234 which are spaced from each other by a distance smaller than a diameter of the sleeve 220.

When the elastic ring 230 is fitted on the outer circumferential surface of the sleeve 220 fitted on the delivery nozzle 196, the elastic ring 230 is elastically deformed so as to increase the distance between the free ends 234. After the elastic ring 230 is fitted on the sleeve 220, the distance between the free ends 234 is restored to the original distance smaller than the diameter of the sleeve 220. Thus, the elastic ring 230 is mounted on the sleeve 220 so as to prevent removal of the elastic ring 230 from the sleeve 220. That is, the free ends 234 function as a retainer portion for retaining the elastic ring 230 on the sleeve 220.

The two arcuate engaging projections 232 of the elastic ring 230 are held in engagement, at intermediate portions of their chords, with the corresponding circumferential portions of the annular groove 224 of the delivery nozzle 196, through the respective the arcuate slots 226 of the sleeve 220. In this state, the elastic ring 230 is rotatable relative to the delivery nozzle 196 about its axis, but is substantially prevented from being moved in the axial direction relative the delivery nozzle 196. Since the engaging projections 232 extend through the arcuate slots 226 formed through the cylindrical wall of the sleeve 220, the sleeve 220 is substantially prevented from being axially moved relative to the elastic ring 230, so that the sleeve 220 is mounted on the delivery nozzle 196 such that the sleeve 220 is rotatable but axially immovable relative to the delivery nozzle 196. While the sleeve 220 is mounted on the delivery nozzle 196 as described above, the end face of the sleeve 220 is spaced from the end face 210 of the delivery nozzle 196 by a small distance in the direction toward the syringe 194.

Figure 13:
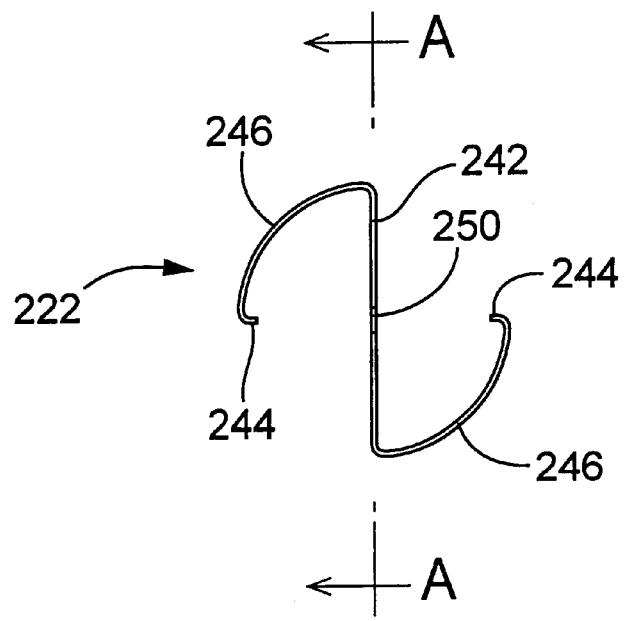
FIG. 13 is a plan view showing the cutting wire.
Figure 14:
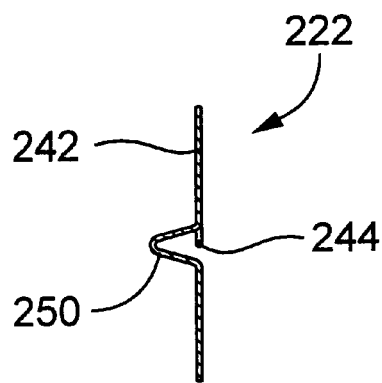
FIG. 14 is a cross sectional view of the cutting wire taken along line 14—14 of FIG. 13.

In the present embodiment, the cutting wire 222 is formed from a spring wire, a kind of a metallic wire. As shown in FIGS. 10, 13 and 14, the cutting wire 222 consists of a transverse portion 242, a pair of engaging ends 244, and a pair of connecting portions in the form of elastically deforming portions 246 that connect the engaging ends 244 to the respective opposite ends of the transverse portion 242. While the cutting wire 222 is fixed to the delivery nozzle 196 via the sleeve 220, the transverse portion 242 traverses the opening 212 of the end face 210 of the delivery nozzle 196 in a diametric direction of the delivery nozzle 196, while the engaging ends 244 are held in engagement with the respective through-holes 228 formed in the sleeve 220.

The transverse portion 242 has an inward bend or projection 250 at a longitudinally middle portion, which projects into the end portion of the delivery nozzle 196. As shown in FIG. 10, the inward projection 250 is most distant from the end face 210 of the delivery nozzle 196 in the axial direction of the delivery nozzle 196, at a central portion of the opening 212 as seen in the radial direction, and the axial distance of inward projection 250 from the end face 210 continuously decreases as the inward projection 250 extends in the radially outward direction of the opening 212. The opposite ends of the inward projection 250 substantially line in a plane which includes the end face 210.

As shown in FIG. 13, the pair of elastically deforming portions 246 extend from the respective opposite ends of the transverse portion 242 in the same circumferential direction along a circle having a center on the apex of the inward projection 250 and lying on a plane which includes parts of the transverse portion 242 except the inward projection 250 and which is perpendicular to a plane including the entirety of the transverse portion 242. When the cutting wire 222 is removed from the sleeve 220, the elastically deforming portions 246 have an arcuate shape following the outer circumferential surface of the sleeve 220, and are not bent in the axial direction of the sleeve 220. The free ends of the two elastically deforming portions 246 are positioned such that a straight line passing the free ends is perpendicular to the transverse portion 242, as seen in the plane of FIG. 13. The elastically deforming portions 246 are bent at the free ends toward the transverse portion 242, whereby the engaging ends 244 are formed. In the present embodiment, the engaging ends 244 are spaced apart from the respective ends of the transverse portion 242 by 90° in the circumferential direction of the above-indicated circle.

The cutting wire 222 is attached to the sleeve 220 such that the inward projection 250 projects into the free end portion of the sleeve 220, while the two elastically deforming portions 246 is held in engagement with the outer circumferential surface of the sleeve 220, with the engaging ends 244 being fitted in the respective through-holes 228. Since the through-holes 228 are spaced from the end face of the sleeve 220, the elastically deforming portions 246 are elastically deformed in the axial direction of the sleeve 220 such that the elastically deforming portions 246 extend helically in both of the axial and circumferential directions of the sleeve 220, for attachment of the cutting wire 222 on the sleeve 220, with the engaging ends 244 fitted in the respective through-holes 228.

On the outer circumferential surface of the sleeve 220, a retainer ring 254 is fitted so as to cover the elastically deforming portions 246 and the engaging ends 244, such that the retainer ring 254 is axially movable relative to the sleeve 220. The retainer ring 254 has a generally cylindrical shape, and includes a flange 256 extending radially inwardly from an inner axial end thereof. In the present embodiment, the above-indicated syringe 194, delivery nozzle 196, sleeve 220 and retainer ring 254 are formed of synthetic resin materials.

The retainer ring 254 is fitted on the sleeve 220 before the sleeve 220 is mounted on the delivery nozzle 196 and before the cutting wire 222 and the elastic ring 230 are attached to the sleeve 220. The retainer ring 254 fitted on the sleeve 220 is positioned as indicated by two-dot chain line in FIG. 10 such that the through-holes 228 are not closed by the retainer ring 254, with the lower end of the retainer ring 254 being located above the through-holes 228 as seen in FIG. 10. In this condition, the cutting wire 222 is attached to the sleeve 220 in the manner as described above.

After the cutting wire 222 is attached to the sleeve 220, the retainer ring 254 is axially moved relative to the sleeve 220, as indicated by solid line in FIG. 10, so as to cover the elastically deforming portions 246 and the engaging ends 244 of the cutting wire 222, for thereby preventing the removal of the cutting wire 222 from the sleeve 220.

With the cutting wire 222 attached to the sleeve 220 the retainer ring 254 preventing the removal of the cutting wire 222, the sleeve 220 is mounted on the delivery nozzle 196, and the elastic ring 230 is fitted for engagement with the sleeve 220 and the delivery nozzle 196, so as to prevent axial movement of the sleeve 220 relative to the delivery nozzle 196 and permit rotation of the sleeve 220 relative to the delivery nozzle 196. In this state, the flange 256 of the retainer ring 254 is sandwiched between the elastic ring 230 and the portions of the cutting wire 222 adjacent to the engaging ends 244, as shown in FIG. 10. Thus, the retainer ring 254 is positioned so as to prevent the removal of the engaging ends 244 from the through-holes 228.

The cutting wire 222 is positioned such that the inward projection 250 of its transverse portion 242 projects into the free end portion of the delivery nozzle 196, while the other parts of the transverse portion 242 is elastically held in contact with the end face 210 of the delivery nozzle 196. The sleeve 220 is mounted on the delivery nozzle 196 such that the end face of the sleeve 220 is slightly spaced from the end face 210 of the delivery nozzle 196 in the axial direction toward the syringe 194. During the mounting of the sleeve 220 on the delivery nozzle 196, therefore, the end face of the sleeve 220 is axially moved relative to the end parts of the transverse portion 246 of the cutting wire 222, with the end parts remaining on the end face 210 of the delivery nozzle 196, so that the elastically deforming portions 246 are further elastically deformed so as to generate an increased elastic force which forces the transverse portion 242 against the end face 210 of the delivery nozzle 196.

In the present embodiment, the sleeve 220 with the cutting wire 222, etc. attached thereto is mounted on the delivery nozzle 196 before the delivery nozzle 196 is attached to the syringe 194. In other words, the delivery nozzle 196 with the sleeve 220, etc. mounted thereon is attached to the syringe 194 such that the externally threaded end portion 205 of the delivery nozzle 196 is screwed into the internal thread 206 formed in the inner circumferential surface of the protruding portion 202 of the syringe 194. In the present embodiment, the delivery nozzle 196 is attached to and removed from the syringe 194, together with the sleeve 220, cutting wire 222, retainer ring 254 and elastic ring 230. When the solder paste in the syringe 194 is exhausted, for instance, the delivery nozzle 196 is removed from the syringe 194, together with the sleeve 220, cutting wire 222, etc., and is then attached to a new syringe 194 filled with the solder paste. Thus, the delivery nozzle 196 with the sleeve 220, cutting wire 222, etc. can be used for a plurality of syringes 194.

A driven rotary element in the form of a driven gear 260 is formed integrally with the sleeve 220, such that the driven gear 260 is located at the axial end of the sleeve 220 remote from the end to which the cutting wire 222 is attached. The driven gear 260 is rotatable about the axis of the delivery nozzle 196. In the present embodiment, the driven gear 260 serving as the driven rotary element is mounted on the delivery nozzle 196, together with the sleeve 220, etc., and is rotated relative to the delivery nozzle 196, together with the sleeve 220, etc. The driven gear 260 may be formed separately from the sleeve 220, and fixed to the sleeve 220, for rotation of the driven gear 260 and the sleeve 220 as a unit.

The holder sleeve 180 accommodating a part of the replenisher 190 is formed of a synthetic resin material, in the present embodiment. As shown in FIG. 9, the holder sleeve 180 has substantially the same shape as that of the syringe 194. The syringe 194 is accommodated into the holder sleeve 180 through one of the axially opposite open ends. The end portion of the holder sleeve 180 remote from this axial open end (not shown) is curved in cross section like the syringe 194, and has an opening 272 which permits the delivery nozzle 196 and the driven gear 260 to pass therethrough. The replenisher 190 is attached to the holder sleeve 180 after the delivery nozzle 196 with the sleeve 220, cutting wire 222, etc. mounted thereon is attached to the syringe 194. The replenisher 190 is inserted into the holder sleeve 180 through the above-indicated axial open end remote from the opening 272, while the delivery nozzle 196 with the sleeve 220 etc. mounted thereon is passed through the opening 272. The replenisher 190 is positioned such that the syringe 194 is accommodated in the holder sleeve 180 while the delivery nozzle 196 with the sleeve 220, etc. extends in the axial direction so as to be located outside the holder sleeve 180.

The axial open end of the holder sleeve 180 which is remote from the opening 272 is fluid-tightly closed by a internally threaded cap 278, as shown in FIG. 6. The cap 278 is screwed on the externally threaded end portion of the holder sleeve 180 until an inner annular surface of the cap 278 comes into abutting contact with the end face of the syringe 194 through a sealing member. In this condition, the lower end portion of the syringe 194 is in abutting contact with the inner bottom surface of the holder sleeve 180, whereby the syringe 194 is positioned in the axial direction relative to the holder sleeve 180. The syringe 194 can be removed from the holder sleeve 180, by removing the cap 278. Thus, the syringe 194 is removably accommodated within the holder sleeve 180.

The holder sleeve 180 holding the replenisher 190 is fixed to the holder plate by the fixing device 178. Namely, the door 166 of the fixing device 178 is opened, and the holder sleeve 180 is fitted in the positioning end portions 162 provided in the recessed portion 160 of the block 134. Then, the door 166 is closed, and is held in the closed position by the latch 168. In this state, the holder sleeve 180 is sandwiched in one radial direction by and between the door 166, and inner surfaces of the positioning end portions 162 that are located opposite to the door 166, and further sandwiched in another radial direction perpendicular to the above-indicated one radial direction, by and between opposite inner surfaces of the positioning end portions 162, which inner surfaces correspond to the respective arms of the U-shape of the positioning end portions 162.

The holder sleeve 180 and the replenisher 190 are positioned in their axial direction, that is, in the longitudinal direction of the holder plate 130, relative to the holder plate 130, by a positioning member in the form of a positioning plate 300 fixed to the holder plate 130, such that a positioning portion in the form of an end portion 302 of the holder plate 130 is fitted in a gap between the flange 208 of the delivery nozzle 196 and the driven gear 260, with the flange 208 resting at its lower surface on the end portion 302, as shown in FIGS. 5 and 6.

An upper space within the syringe 194 of the replenisher 190 held by the holder sleeve 180 is selectively communicated through a joint 279, an air passage 280 and solenoid-operated directional control valves 282, 284, with a positive pressure source 286, a negative pressure source 288 and the atmosphere. The solenoid-operated directional control valves 282, 284 have three combinations of their operating states which establish respective three operating states of the upper space within the syringe 194, namely, a pressurizing state in which the upper space is communicated with the positive pressure source 286, a sucking state in which the upper space is communicated with the negative pressure source 288, and a neutral state in which the upper space is communicated with the atmosphere. The delivery of the solder paste from the delivery nozzle 196 is controlled by controlling the directional control valves 282, 284 for selective communication of the upper space of the syringe 194 with the positive pressure source 286, atmosphere and negative pressure source 288, to control the pressure in the upper space to be positive, atmospheric and negative. In the present embodiment, the solenoid-operated directional control valves 282, 284 constitute a directional control valve device 290, and cooperate with the positive and negative pressure sources 286, 288 to constitute a delivery control device 292.

Figure 15:
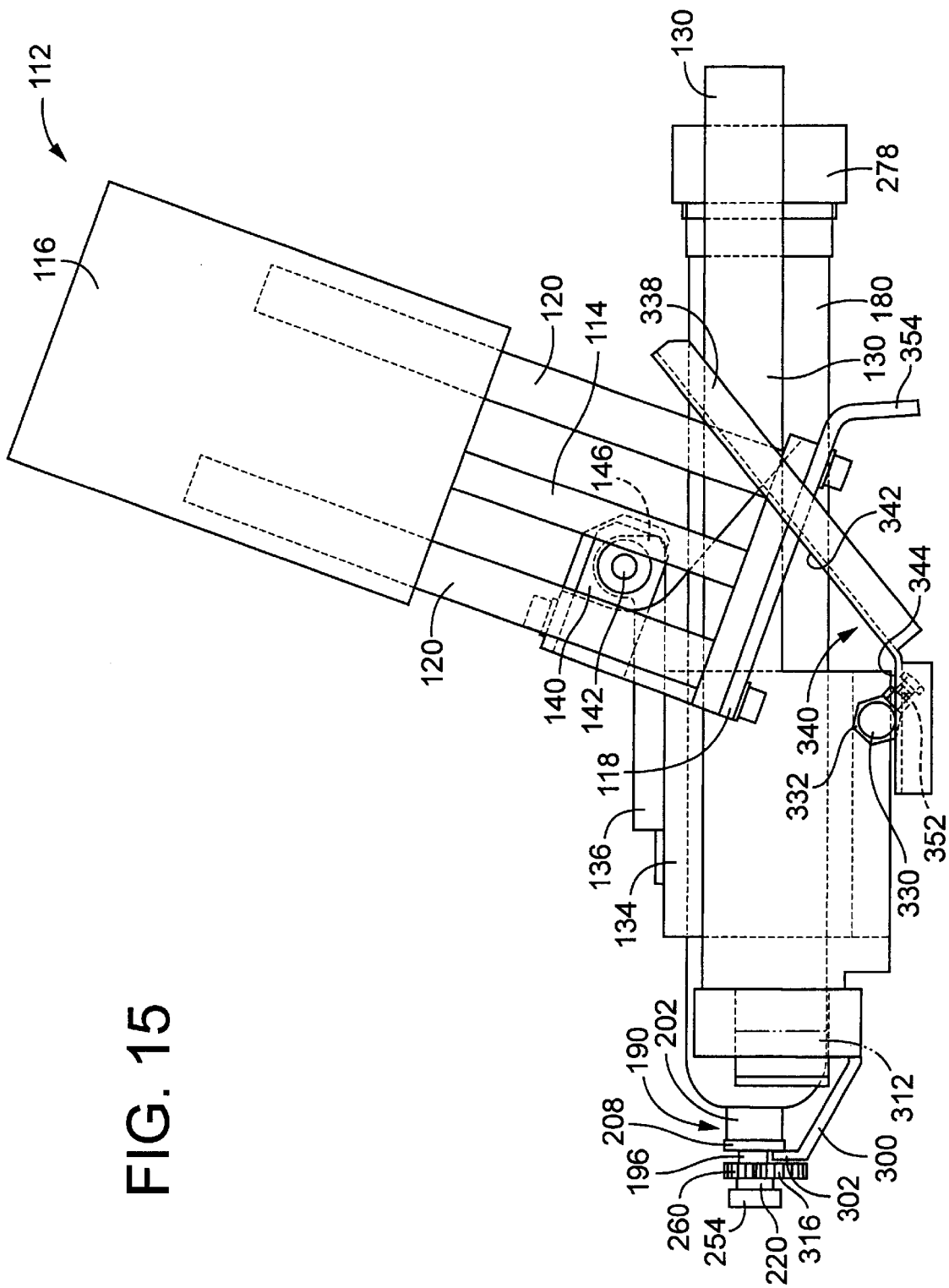
FIG. 15 is a view showing the replenisher placed in a standby attitude.

As shown in FIGS. 6 and 9, a rotary drive device 310 for rotating the sleeve 220 is disposed on the holder plate 130. The rotary drive device 310 includes a rotary drive device serving as a drive source in the form of an air cylinder 312, a rotary rotary-motion transmitting device 314 for transmitting a rotary motion of the rotary air cylinder 312 to the driven gear 260, and a driving rotary element in the form of a drive gear 316. The rotary air cylinder 312, rotary-motion transmitting device 314 and drive gear 316 are supported by the holder plate 130. As shown in FIG. 9, the rotary air cylinder 312 is mounted on the holder plate 130 such that its drive shaft extends downwards in the longitudinal direction of the holder plate 130 and the axial direction of the holder sleeve 180. The rotary-motion transmitting device 314 includes a gear 318 fixed to the drive shaft of the rotary air cylinder 312, and a plurality of gears 320, 322, 324 for transmitting a rotary motion of the gear 318 to the drive gear 316. In FIGS. 5 and 15, the gears 318, 320, 322, 324 are not shown.

While the replenisher 190 is held by the holder plate 130 via the holder sleeve 180, as described above, the driven gear 260 is held in meshing engagement with the drive gear 316, so that the sleeve 220 can be rotated relative to the delivery nozzle 196 when the driven gear 260 is driven by operation of the rotary air cylinder 312. When the holder sleeve 180 is removed from the holder plate 130, the driven gear 260 is disengaged from the drive gear 316.

Figure 16:
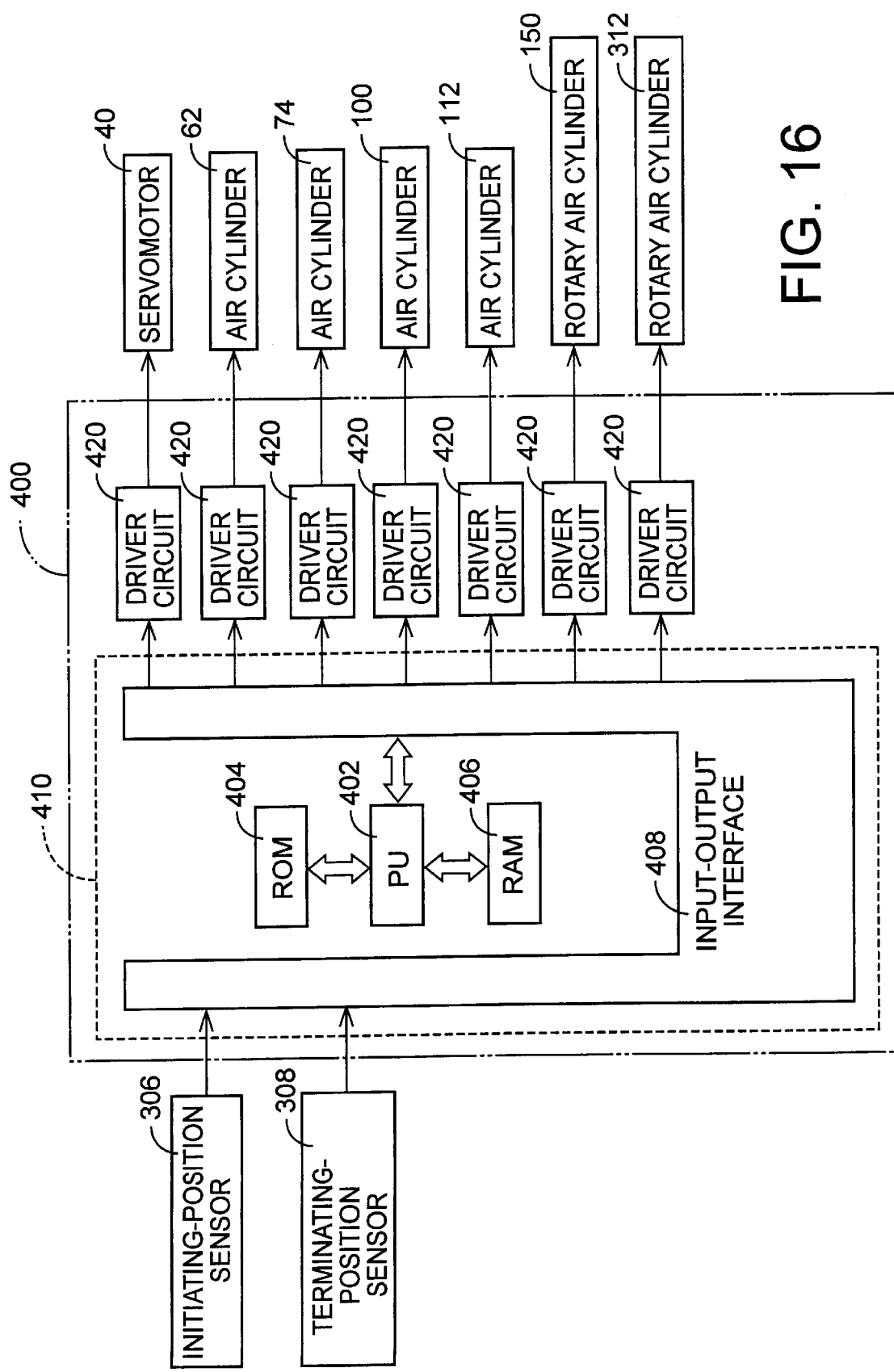
FIG. 16 is a block diagram showing a portion of a control device of the screen printer, which significantly relates to the present invention.

When the replenisher 190 is held by the holder plate 130 with the holder sleeve 180 held by the holder plate 130, the second bracket 110, the holder plate 130 and the replenisher 190 can be moved in the horizontal direction and/or the vertical direction when the second bracket 110 is moved in the horizontal direction and/or the first bracket 118 is moved in the vertical direction. In the present embodiment, the second bracket 110 is normally placed in a standby position which is distant from the solder dispenser 50 (solder replenishment object) in the direction of width of the screen 14 and in the longitudinal direction of the solder container, which is parallel to the horizontal direction. In operation of the replenisher 190, the second bracket 110 is first moved by the horizontal drive device 102 from the standby position to a solder-supply initiating position, and is then moved from the solder-supply initiating position to a solder-supply terminating position. The solder-supply initiating position corresponds to one longitudinal end of the solder dispenser 50, and is a horizontal position at which an operation to replenish the solder-accommodating chamber 70 with the solder paste is initiated. The solder-supply terminating position corresponds to the other longitudinal end of the solder-accommodating chamber 70, and is a horizontal position at which the operation to replenish the solder dispenser 50 is terminated. An area which lies between the solder-supply initiating and terminating positions in the direction of width of the screen 14 and which corresponds to the longitudinal dimension of the chamber 70 will be referred to as an "solder-replenishing area" in which the chamber 70 is replenished with the solder paste by the replenisher 190. The solder-supply initiating and terminating positions of the second bracket 110 are respectively detected by an initiating-position sensor 306 and a terminating-position sensor 308, which are disposed on the guide rail 94, as shown in FIG. 16.

In the present embodiment, the attitude of the replenisher 190 is changed by utilizing the horizontal movement of the second bracket 110 and the vertical movement of the first bracket 118. To this end, a cam follower in the form of a roller 330 is disposed on the holder plate 130 such that the roller 330 is rotatable about a horizontal axis which intersects the axis of the holder sleeve 180 held by the holder plate 130 and which is parallel to the direction of movement of the second bracket 110. A spacer 332 extends from a surface of the holder plate 130 remote from the surface on which the holder plate 130 is supported. The roller 330 is rotatably supported at a free end of the spacer 332. The spacer 332 holding the roller 330 extends from the holder plate 130 in the direction of movement of the second bracket 110 toward the standby position. In this arrangement, an interference of the rotary drive device 310 with a plate cam 338 (described below) is prevented when the roller 330 comes into contact with the plate cam 338.

On a portion of the frame 90 corresponding to the standby position of the second bracket 110, there is fixed a bracket 336 such that the bracket 336 extends toward the solder replenishing device 22 in the printing direction, as shown in FIGS. 5 and 6. To a side surface of the bracket 336 on the side of the holder plate 130, there is fixed the above-indicated plate cam 338. The cam 338 has a cam surface 340 having an inclined portion 342 and a horizontal portion 344. The inclined portion 342 is inclined with respect to the direction of movement of the first bracket 118 and the horizontal plane such that the inclined portion 342 approaches the solder-paste printing device 20 or the frame 90 as it extends downwards. The horizontal portion 344 extends from the lower end of the inclined portion 342 in the horizontal direction. The horizontal portion 344 is also inclined with respect to the direction of movement of the first bracket 118, such that the angle of inclination of the horizontal portion 344 with respect to the direction of movement of the first bracket 118 is larger than that of the inclined portion 342. The cam surface 340 is perpendicular to the side surface of the bracket 336.

When the second bracket 110 is located in the solder-replenishing area, or when the second bracket 110 is located at the standby position while the first bracket 118 is at the uppermost position, the replenisher 190 maintains a solder-replenishing attitude of FIG. 5 established by the operation of the rotary air cylinder 150 described above. In the solder-replenishing attitude, the syringe 194 has an attitude in which its longitudinal direction is almost parallel to the vertical direction, while the delivery nozzle 196 extends almost downwards.

In the present embodiment, the rotary air cylinder 150 is kept operated in a direction that causes the holder plate 130 to pivot in the counterclockwise direction as seen in FIG. 5, for causing the roller 330 to come into contact with the plate cam 338 when the second bracket 110 is placed in the standby position. When the second bracket 110 is located in the solder-replenishing area, or when the second bracket 110 is located at the standby position while the first bracket 118 is at the uppermost position, a maximum angle of the counterclockwise pivoting of the holder plate 130 by the rotary air cylinder 150 is determined by abutting contact of a projection 352 provided on the holder plate 130, with a stop 354 provided on the first bracket 118, so that the solder-replenishing attitude of the replenisher 190 is maintained. As shown in FIG. 6, the projection 352 is a threaded member screwed into the spacer 332. The solder-replenishing attitude (angle of inclination with respect to the horizontal plane) of the replenisher 190 can be adjusted by adjusting the amount of projection of the projection 352 from the spacer 332. In the present embodiment, the fluid-actuated cylinder serving as the rotary drive source in the form of the rotary air cylinder 150 functions as a replenisher-attitude holding device for maintaining the solder-replenishing attitude of the replenisher 190, and a replenisher biasing device for biasing the replenisher 190 to establish the solder-replenishing attitude.

When the holder plate 130 is lowered and lifted with the vertical movement of the first bracket 118 while the second bracket 110 is located at the standby position, the roller 30 rolls on the cam surface 340, so that the holder plate 130 is pivoted due to inclination of the cam surface 340 with respect to the direction of movement of the first bracket 118, whereby the attitude of the replenisher 190 is changed. When the first bracket 118 is placed in its uppermost position with the second bracket 110 located at the standby position, the roller 330 is spaced apart from the cam surface 340, as indicated by solid line in FIG. 5, so that the replenisher 190 has the solder-replenishing attitude.

When the first bracket 118 is lowered from the uppermost position to the lowermost or fully lowered position, the roller 330 comes into rolling contact with the cam surface 340, rolling initially on the inclined portion 342 and then on the horizontal portion 344. Since the inclined portion 342 and the horizontal portion 344 are inclined with respect to the direction of movement of the first bracket 118, the holder plate 130 is pivoted in the clockwise direction as seen in FIG. 5, so that the replenisher 190 is pivoted to have a standby attitude of FIG. 15 in which the longitudinal directions of the syringe 194 and the delivery nozzle 196 are parallel to the horizontal direction.

Since the roller 330 contacts the inclined portion 342 whose angle of inclination with respect to the direction of movement of the first bracket 118 is comparatively small, the holder plate 130 can be smoothly pivoted with a comparatively large angular moment or torque. A short time before the first bracket 118 is lowered to the lowermost position, the roller 330 initiates rolling contact with the horizontal portion 344 whose angle of inclination with respect to the direction of movement of the first bracket 118 is comparatively large, so that a rate of increase of the pivoting angle of the holder plate 130 with an increase of the distance of downward movement of the first bracket 118 is made higher when the roller 330 rolls on the horizontal portion 344 than when the roller 330 rolls on the inclined portion 342. When the first bracket 118 is located at the lowermost position, the replenisher 190 has the standby attitude with its longitudinal direction extending in the horizontal direction. This arrangement permits easy pivoting of the holder plate 130 by a suitable angle necessary to establish the standby attitude or horizontal posture, while minimizing the required operating stroke of the first bracket 118.

Since the rotary air cylinder 150 is kept operated, the holder plate 130 is pivoted against an operating force of the rotary air cylinder 150 when the attitude of the replenisher 190 is changed from the solder-replenishing attitude to the standby attitude. While the holder plate 130 is pivoted by the rolling contact of the roller 330 with the plate cam 338 to change its attitude from the solder-replenishing attitude to the standby attitude, the rotary air cylinder 150 functions to effectively prevent separation or floating of the roller 330 apart from the cam surface 340.

When the replenisher 190 is held in the standby attitude due to its own weight, the roller 330 is held in contact with the horizontal portion 344 of the cam surface 340. Therefore, the standby attitude may be maintained even if the rotary air cylinder 150 is placed in its non-operated state. In this embodiment, however, the rotary air cylinder 150 is held in the operated state to bias the holder plate 130 in the counterclockwise direction as seen in FIG. 5, to maintain the standby attitude of the replenisher 190 with a higher degree of stability.

When the first bracket 118 is lifted from the lowermost position to the uppermost position, the roller 330 rolls on the cam surface 340, in the direction from the horizontal portion 344 to the inclined portion 342, so that the holder plate 130 is pivoted in the counterclockwise direction as seen in FIG. 15, with a result of changing the attitude of the replenisher 190 from the standby attitude to the solder-replenishing attitude. Since the rotary air cylinder 150 is kept operated to bias the holder plate 130 in the pivoting direction for holding the roller 330 in contact with the cam surface 340, the roller 330 is held in roller contact with the cam surface 340 while the attitude is changed from the standby attitude to the solder-replenishing attitude. In the present embodiment, the downward movement of the first bracket 118 is converted by the roller 330 and the plate cam 338 into the pivoting movement of the holder plate about the horizontal axis for pivoting the replenisher 190 to have the horizontal posture. Thus, the roller 330, cam 338 and elevator device 122 constitute a major portion of an attitude-changing device.

While the second bracket 110 is located in the solder-replenishing area spaced apart from the standby position in the longitudinal direction of the solder dispenser 50, the movement of the first bracket 118 between the uppermost and lowermost positions does not cause the roller 330 to contact the plate cam 338, in the absence of the plate cam 338 in the solder-replenishing area. Accordingly, the holder plate 130 is vertically moved without a pivoting movement while the solder replenishing-attitude of the replenisher 190 is maintained. When the first bracket 118 is located at the lowermost position, the replenisher 190 is placed in its solder-replenishing position indicated by two-dot chain line in FIG. 5, which is relatively close to the solder dispenser 50 of the solder printing device 20. When the first bracket 118 is located at the uppermost position, the replenisher 190 is placed in its retracted position indicated by solid line in FIG. 5, which is located above the solder-replenishing position and at which the replenisher 190 does not interfere with the solder dispenser 50.

The present screen printer 10 is provided with a control device 400 illustrated in the block diagram of FIG. 16. The control device 400 is principally constituted by a computer 410 incorporating a processing unit (PU) 402, a read-only memory (ROM) 404, a random-access memory (RAM) 406 and an input-output interface 408. To the input-output interface 408, there are connected through driver circuits 420 the servomotor 40, air cylinder 62 and various other actuators described above. Described more precisely, the air cylinder 62 and other air cylinders are connected to solenoid-operated switching valves which are connected to the driver circuits 420 and which are provided to control the air pressure in the air chambers of the air cylinders. The ROM 404 stores various control programs such as programs for applying the solder paste to the printed-wiring board 16, programs for replenishing the solder dispenser 50 with the solder paste.

In the screen printer 10 constructed as described above, the operation to apply the solder paste to the printed-wiring board 16 is initiated with an operation of the board transferring device (not shown) to transfer the printed-wiring board 16 onto the printed-wiring-board supporting and positioning device 18, and an operation of the device 18 to position the board 16 such that the board 16 is in contact with the back surface of the printing screen 14. Then, the pressure-coating head 30 is lowered for contacting the top surface of the screen 14. The pressure-coating head 30 is moved relative to the screen 14 while the solder extruding device 78 is operated to extrude the solder paste from the solder container 70, so that the solder paste is applied to the top surface of the board 16 through the mesh of the screen 14.

When the amount of the solder paste left in the solder-accommodating chamber 70 of the solder dispenser 50 has come smaller than a certain lower limit, the solder replenishing device 22 is operated to replenish the solder-accommodating chamber 70 with the solder paste. The amount of the solder paste left in the solder-accommodating chamber 70 is detected or estimated by a suitable device. For instance, the residual amount of the solder paste can be estimated on the basis of the number of the printed-wiring boards 16 to which the solder paste has been applied, or can be detected on the basis of the lowered position of the extruding member 72.

Figure 4:
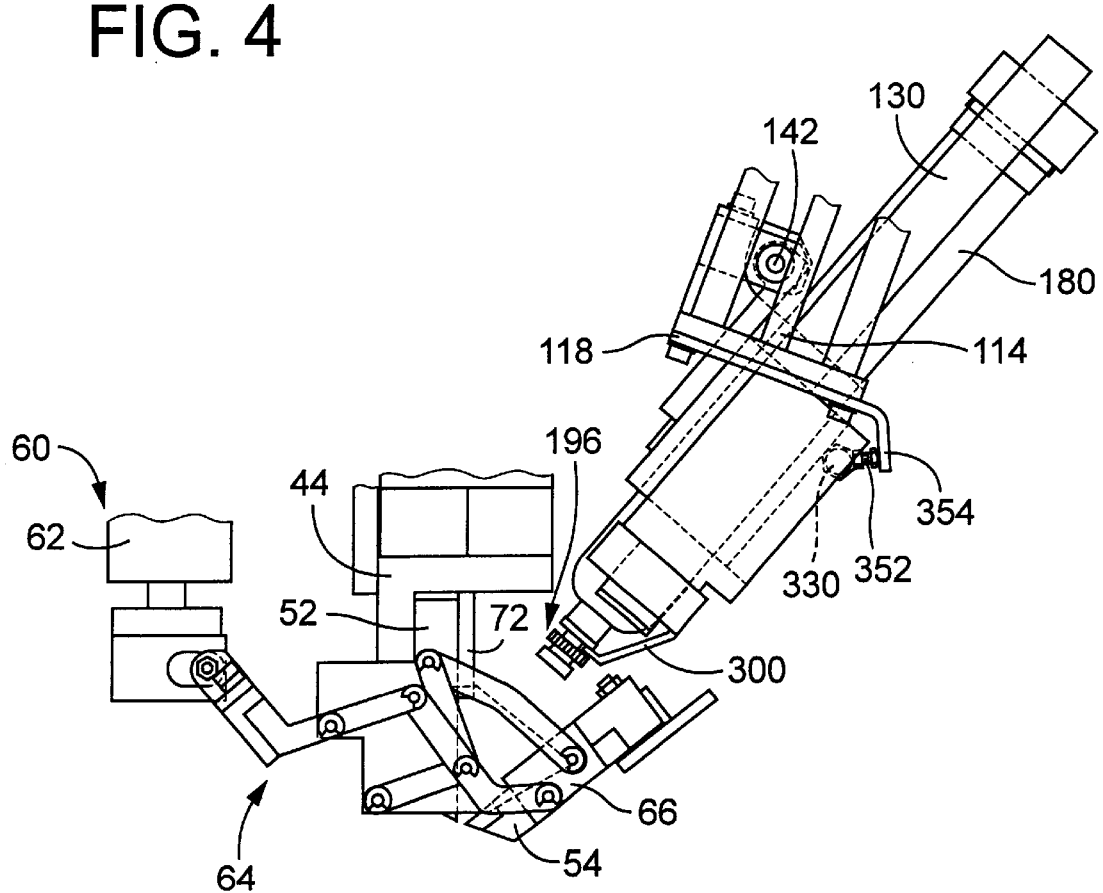
FIG. 4 is a front elevational view showing the pressure-coating head with its solder accommodating portion in an open state, and the solder replenishing device with its replenisher placed in an operating state for replenishing the solder accommodating portion with a solder paste.

When the solder-accommodating chamber 70 is replenished with the solder paste, the pressure-coating head 30 is moved to the non-printing area in which the solder replenishing device 22 is located. Then, the second member 54 of the solder dispenser 50 is pivoted to open the chamber 70, as shown in FIG. 4. During a printing operation to apply the solder paste to the printed-wiring board 16, the replenisher 190 of the solder replenishing device 22 is placed in the standby position having the standby attitude, as shown in FIG. 15, and is ready for the solder replenishing operation.

Before the solder replenishing operation is initiated, the attitude of the replenisher 190 is changed from the standby attitude to the solder-replenishing attitude. To this end, the first bracket 118 is moved upwards by the elevator device 122, to pivot the holder plate 130 and the replenisher 190, with the roller 330 held in rolling contact with the cam surface 340 in the direction from the horizontal portion 344 to the inclined portion 342, so that the replenisher 190 has the solder-replenishing attitude indicated by solid line in FIG. 5. When the first bracket 118 has reached the uppermost position, the roller 330 is spaced apart from the cam surface 340, and the projection 352 comes into abutting contact with the stop 354. The abutting contact of the projection 352 with the stop 354 is maintained by an operation of the rotary air cylinder 150, and the solder-replenishing attitude of the replenisher 190 is maintained. In this state in which the first bracket 118 is located at the uppermost position, the replenisher 190 is placed in the retracted position and has the solder-replenishing attitude.

In this state, second bracket 110 is moved by the horizontal drive device 102 from the standby position into the solder-replenishing area. The second bracket 110 is temporarily stopped at the solder-supply initiating position at one end of the solder-replenishing area, on the basis of the output signal of the initiating-position sensor 306. In this solder-supply initiating position, the first bracket 118 is lowered. In the absence of the plate cam 338 in the solder-replenishing area, the downward movement of the first bracket 118 does not cause a pivotal movement of the holder plate 130, so that the replenisher 190 is moved downwards from the retracted position to the solder-replenishing position, while maintaining its solder-replenishing attitude indicated by two-dot chain line in FIG. 5. As a result, the lower end portion of the delivery nozzle 196 is inserted in between the first and second members 52, 54 defining the solder-accommodating chamber 70, as shown in FIG. 4.

Then, the directional control valve device 290 is switched to establish the pressurizing state in which the upper space of the syringe 194 of the replenisher 190 is communicated with the positive pressure source 286, so that float 198 is pressed down by the positive pressure in the upper chamber, whereby the solder paste is extruded from the delivery nozzle 196. The replenisher 190 is moved with the second bracket 110, by the horizontal drive device 120, from the solder-supply initiating position toward the solder-supply terminating position, in the longitudinal direction of the solder-accommodating chamber 70, while the solder paste is delivered from the delivery nozzle 196. Thus, the solder-accommodating chamber 70 is replenished with the solder paste. While the cutting wire 222 is partly located within the free end portion of the delivery nozzle 196, the cutting wire 222 does not disturb a flow of the solder paste out of the delivery nozzle 196, since the cutting wire 222 lies on a plane parallel to the axis of the delivery nozzle 196.

The second bracket 110 is stopped at the solder-supply terminating position, and the directional control valve device 290 is switched to maintain the neutral state for a predetermined time T1 while the replenisher 190 is held in the solder-replenishing position. In the neutral state, the upper chamber of the syringe 194 is held at the atmospheric pressure, so that the solder paste is not delivered from the delivery nozzle 196. When the predetermined time T1 has passed, the sleeve 220 is rotated by the rotary drive device 310, so that a mass of the solder paste bridging the end of the delivery nozzle 196 and a mass of the solder paste within the solder-accommodating chamber 70 is cut off by the cutting wire 222. The sleeve 220 is required to be rotated through at least 180°, and is preferably rotated at least one full turn (through at least 360°. In the present embodiment, the sleeve 220 is rotated two turns, by a rotation motion of the rotary air cylinder 312 through 270° which is transmitted to the driven gear 260 through the rotary-motion transmitting device 314. Since the upper space of the syringe 194 is kept at the atmospheric pressure, the solder paste is cut off by the cutting wire 222 while the solder paste is kept stationary.

The portion of the solder paste within the opening 212 of the delivery nozzle 196 is cut off in a conical shape following the shape of the inward projection 250 of the cutting wire 222, which projects into the free end portion of the delivery nozzle 196. On the other hand, the portion of the solder paste located radially outwardly of the opening 212 is cut off in a plane including the end face 210, by the transverse portion 242 which is held in pressing contact with the end face 210 of the delivery nozzle 196 under the elastic force of the cutting wire 222 per se. Thus, the mass of the solder paste which has projected out of the opening 212 and extended outwardly from the end face 210 before the cut-off operation can be cut off so that the solder paste is located outside the delivery nozzle 196.

After the solder paste is cut off, the directional control valve device 290 is switched to maintain the sucking state for a predetermined time T2. In the sucking state, the upper space of the syringe 194 is communicated with the negative pressure source 288, so that the portion of the solder paste left adjacent to the opening 212 of the delivery nozzle 196 is sucked upwards toward the syringe 194. Then, the sleeve 220 is rotated again. This rotation is effective to cut off the portion of the solder paste which has not been sucked up and is left adjacent the opening 212. After this second cut-off operation, the upper space in the syringe 194 is communicated with the atmosphere.

After the operation to cut-off the solder paste is terminated, the first bracket 118 is moved upwards, to move the replenisher 190 from the solder-replenishing position to the retracted position, so that the free end portion of the delivery nozzle 196 is moved away from the solder-accommodating chamber 70. Then, the horizontal drive device 102 is operated to move the second bracket 110 to the standby position, and the first bracket 118 is lowered to the lowermost position. In the presence of the plate cam 338 in the standby position, the roller 330 comes into contact with the cam surface 340 during the downward movement of the first bracket 118, so that the holder plate 130 is pivoted in the clockwise direction as seen in FIG. 5, by the rolling contact of the roller 330 with the cam surface 340, whereby the replenisher 190 is pivoted to change its attitude from the solder-replenishing attitude back to the standby attitude.

When the first bracket 118 is located at the lowermost position, the roller 330 is held in contact with the horizontal portion 344 of the cam surface 340, and the holder plate 130 and the replenisher 190 are held in the standby attitude due to their own weights, so that the replenisher 190 is ready for the next replenishing operation. In the standby attitude of the replenisher 190 in which the longitudinal direction of the syringe 194 and the delivery nozzle 196 is parallel to the horizontal direction, the level of the solder paste within the syringe 194 is lowered, and the pressure acting on a mass of the solder paste adjacent to the delivery nozzle 196 due to the weight of the solder paste mass within the syringe 194 is reduced. In the present embodiment in which the upper space in the syringe 194 is held at the atmospheric pressure after the second cut-off operation, the solder paste mass in the syringe 194 is not pressed by the pressure in the upper space, thereby effectively prevent the solder paste from drooping from the opening 212 at the free end of the delivery nozzle 196 or dropping off the free end. In the present embodiment, the replenisher 190 is held in its standby attitude while the screen printer 10 is at rest or in the standby state.

It will be understood from the foregoing description of the present embodiment that the syringe 194 functions as a printing-agent container for accommodating a printing agent in the form of the solder paste, and that the sleeve 220 and retainer ring 254 constitute a major part of a cutting-wire holding device. It will also be understood that a portion of the computer 410 assigned to control the delivery control device 292 and the rotary drive device 310 constitutes a main control device.

In the first embodiment described above, the cutting wire 222 is attached to the delivery nozzle 196 of the replenisher 190 via the sleeve 220. However, the cutting wire may be attached to a body of the replenisher 190, that is, to the syringe 194, or alternatively attached to the replenisher holding device 182. For instance, the cutting wire is attached to a cylindrical portion which extends from a portion of the bottom wall of the syringe 194, which portion has the opening 272. A device for attaching the cutting wire to this cylindrical portion may be similar to the cutting-wire holding device in the first embodiment, which includes the sleeve 220 and the retainer ring 254. The cutting wire may be attached to the cylindrical portion such that the cutting wire is held in contact with the end face 210 of the delivery nozzle 196 under an elastic force of the cutting wire per se, when the replenisher 190 is held by the holder sleeve 180. Although the cutting wire is preferably held in contact with the end face 210, this arrangement is not essential. The principle of this invention can be practiced even where the cutting wire is held in close proximity to the end face 210. This is true for the first embodiment.

In the illustrated embodiment, the elevator device 122 is arranged to move the first bracket 118 for moving the replenisher 190 to a selected one of the retracted position and the solder-replenishing position in which the replenisher 190 has the standby attitude and the solder-replenishing attitude, respectively. However, the elevator device 122 may be arranged to move the first bracket 118 for moving the replenisher 190 to a third position as well as the retracted and solder-replenishing positions, so that the attitude of the replenisher 190 is also changed when the replenisher 190 is moved to above-indicated third position. An example of this modified arrangement will be briefly described by reference to FIG. 17.

Figure 17:
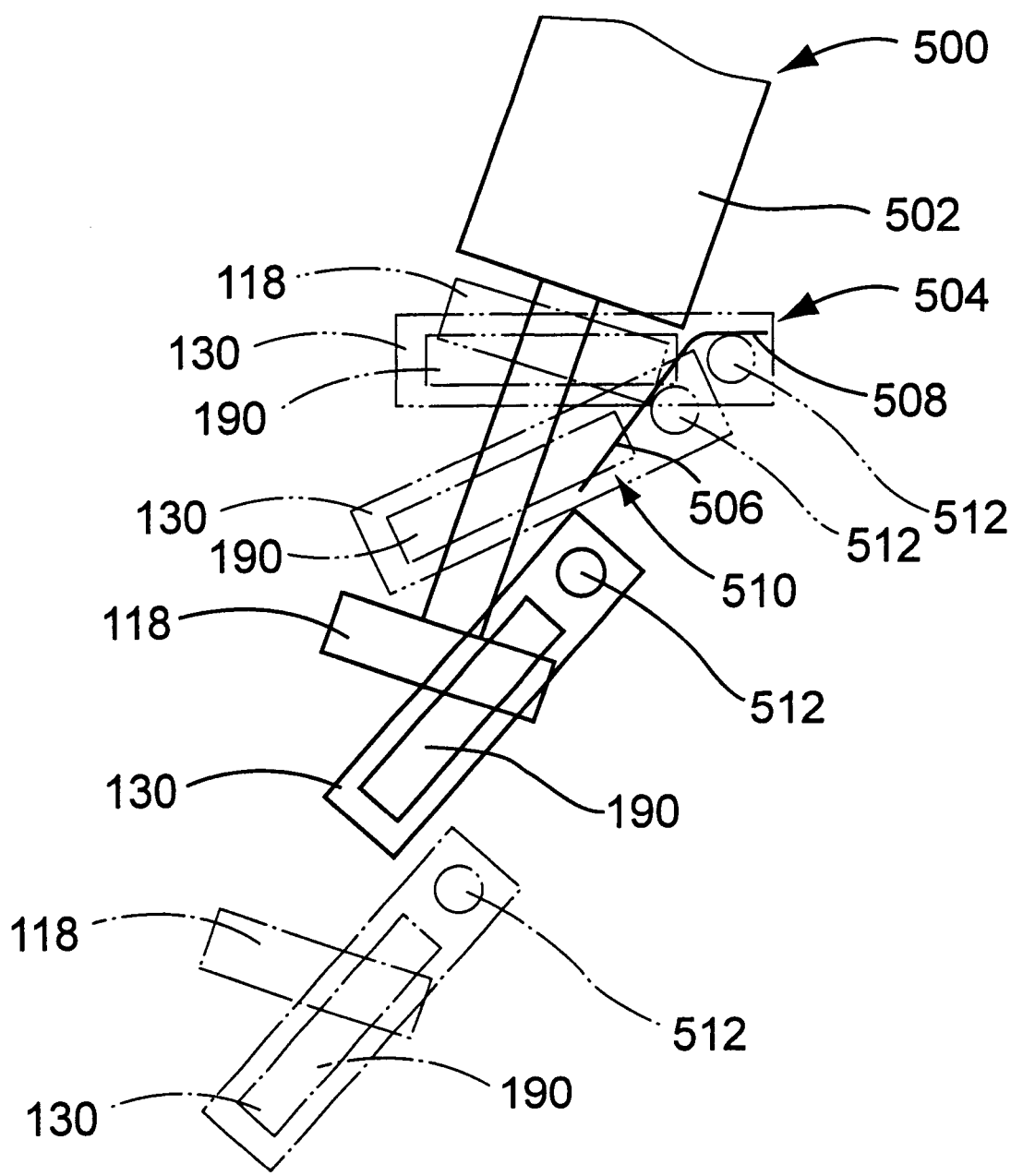
FIG. 17 is a front elevational view schematically showing a printing-agent replenishing device according to another embodiment of this invention.

A solder replenishing device according to the second embodiment of FIG. 17 uses an elevator device 500 including an air cylinder 502. The elevator device 500 is arranged to move the first bracket 118 for moving the replenisher 190 to a selected one of a solder-replenishing position indicated by one-dot chain line in FIG. 17, a retracted position indicated by solid line, and an attitude-changing position indicated by two-dot chain line. The attitude-changing position is located above the retracted position. A cam 504 is fixedly disposed on a portion of the frame 92 (not shown), which corresponds to the standby position of the second bracket 110 (not shown) in the horizontal direction and which is located between the retracted and attitude-changing positions in the vertical direction.

The cam 504 has a cam surface 510 including an inclined portion 506 and a horizontal portion 508 which are inclined with respect to the direction of movement of the first bracket 118. When the second bracket 110 is located at the standby position, the first bracket 118 is moved upwards to move the replenisher 190 to the attitude-changing position above the retracted position. During this upward movement, a cam follower in the form of a roller 512 comes into contact with the inclined portion 506 of the cam surface 510, and then rolls on the inclined portion 506. As a result, the holder plate 130 is pivoted in the clockwise direction as seen in FIG. 17, due to the inclination of the inclined portion 506 with respect to the direction of the upward movement of the first bracket 118, so that the replenisher 190 is accordingly pivoted to change its attitude from the solder-replenishing attitude to the standby attitude. In the present embodiment, the elevator device 500, cam 504 and roller 512 constitute a major part of an attitude-changing device.

In each of the first and second embodiments described above, the attitude of the replenisher 190 is changed by utilizing the vertical movement of the first bracket 118. However, the attitude may be changed by utilizing the horizontal movement of the second bracket 110. An example of this modified arrangement will be briefly described by reference to FIGS. 18 and 19.

Figure 18:
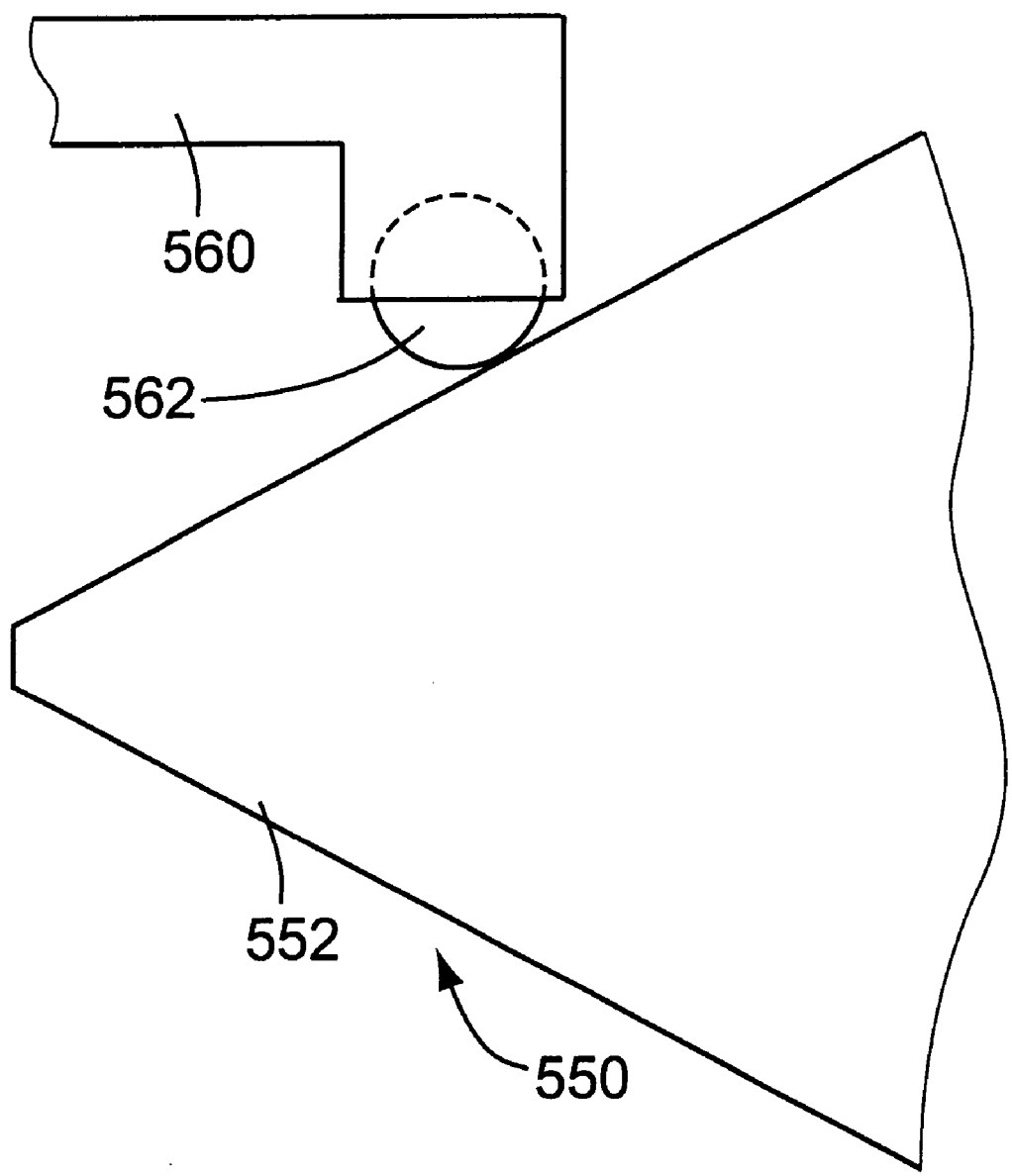
FIG. 18 is a front elevational view schematically showing a printing-agent replenishing device according to a further embodiment of FIG. 17.

As shown in FIG. 18, a cam 550 is fixedly disposed on a portion of a frame (not shown), which corresponds to the standby position of a second bracket (not shown) in the horizontal direction. The cam 550 has a frustoconical shape, and is positioned such that its axis extends in a horizontal direction parallel to the direction of movement of the second bracket, and such that the small-diameter end portion is located on the side of the solder-replenishing area. The cam 550 has a tapered cam surface 552.

In the present third embodiment, a holder plate is disposed on a first bracket which is vertically movably disposed on the horizontally movable second bracket. Like the holder plate 130 in the first and second embodiments, the holder plate in the third embodiment is pivotable about a horizontal axis parallel to the direction of movement of the second bracket. The holder plate is provided with an arm 560 shown in FIG. 18. The arm 560 extends from the holder plate in the above-indicated horizontal direction toward the standby position of the second bracket. The arm 560 rotatably holds, at its free end, a cam follower in the form of a ball 562, and thus functions as a cam-follower holding member for holding the cam follower in the form of the ball 562.

Figure 19:
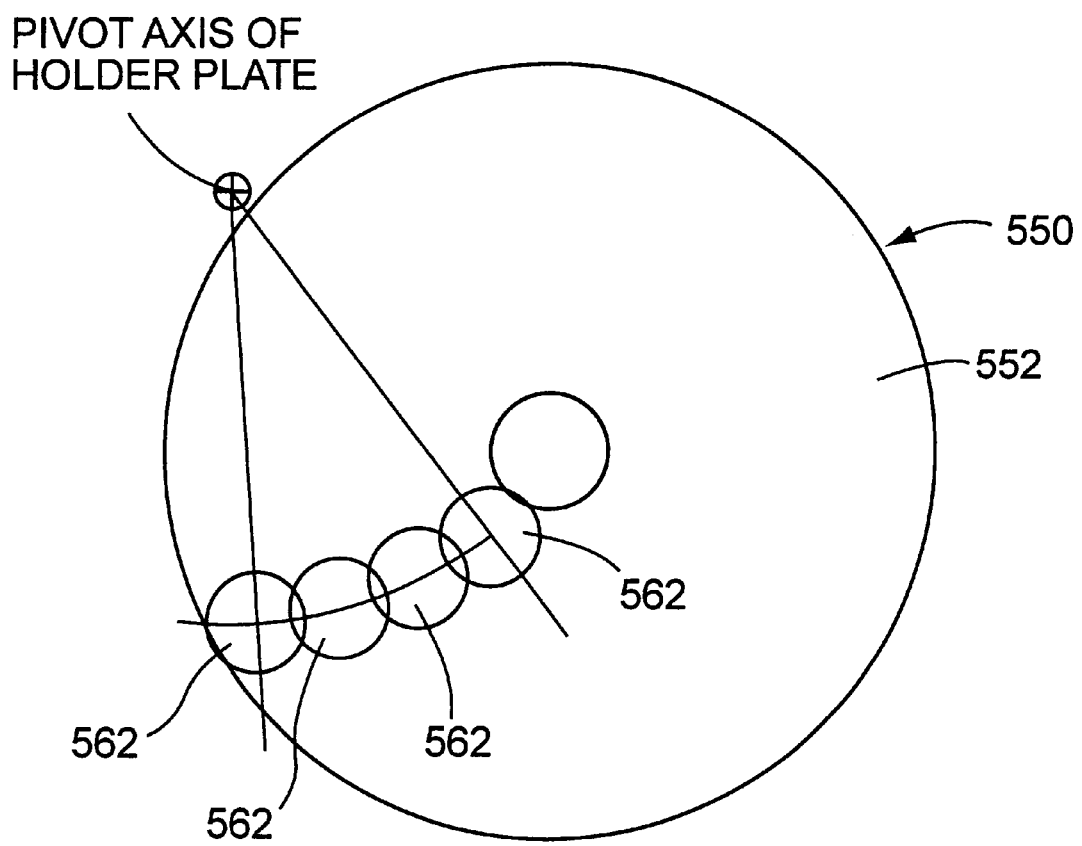
FIG. 19 is a view for explaining a change of the attitude of a replenisher of the printing-agent replenishing device of FIG. 18.

While the second bracket is moved from the solder-replenishing area toward the standby position after the solder dispenser 50 is replenished with the solder paste, the ball 562 comes into contact with an axially intermediate portion of the tapered cam surface 552 when the second bracket has approached the standby position. Then, the ball 562 rolls on the tapered cam surface 552. As the second bracket is further moved toward the standby position, the diameter of the tapered cam surface 552 at which the ball 562 contact the surface 552 increases, as indicated in FIG. 19, so that the arm 560 is pivoted about the pivot axis of the holder plate, and the holder plate and the replenisher are accordingly pivoted, whereby the attitude of the replenisher is changed from the solder-replenishing attitude to the standby attitude. It is noted that FIG. 19 is a cross sectional view of the cam 550 taken in a plane which is perpendicular to the axis of the cam 550 and which corresponds to the diameter of the tapered cam surface 552 at which the ball 562 contacts the surface 552. Since the ball 562 is held by the arm 560 extending from the holder plate, the holder plate does not interfere with the cam 550 when the holder plate is pivoted by rolling engagement of the ball 562 with the cam surface 552. In the present embodiment, the horizontal drive device for moving the second bracket, cam 550 and ball 562 constitute an attitude-changing device for changing the attitude of the replenisher.

While the cam 550 used in the embodiment of FIGS. 18 and 19 is a frustoconical member, this embodiment may use a cam of any other configuration as long as the cam has a cam surface on which the ball 562 rolls as the second bracket is moved in the horizontal direction.

In the illustrated embodiments, the cams 338, 504 and 550 are disposed on a portion of the stationary frame (92) which corresponds to the standby position of the second bracket (110), while the cam follower 330, 512, 562 is disposed on the holding member in the form of the holder plate (130) for holding the replenisher 190. However, the cam and the cam follower may be disposed on the holding member and the stationary frame, respectively.

The illustrated embodiments are arranged such that the replenisher 190 has the standby attitude in which the longitudinal direction of the replenisher 190 and its delivery nozzle 196 is completely parallel to the horizontal plane. However, the longitudinal direction of the replenisher 190 in the standby attitude need not be completely parallel to the horizontal plane, but may be slightly inclined with respect to the horizontal plane such that the delivery end of the delivery nozzle 196 is lower than the end of the replenisher remote from the delivery end.

In the illustrated embodiments, the rotary air cylinder 190 provided to maintain the solder-replenishing attitude of the replenisher 190 is operated to apply a force to the holder plate 130 only in the direction for contact of the roller 330, 512, 562 with the cam 338, 504, 550. However, the rotary air cylinder 190 may be operated to apply a force to the holder plate 130 in the opposite direction, as well. For instance, the rotary air cylinder may be operated produce an assisting force for pivoting the holder plate 130 in the clockwise direction as seen in FIG. 5, for thereby changing the attitude of the replenisher 190 from the standby attitude to the solder-replenishing attitude. In this case, the rotary air cylinder 150 functions as an attitude-change assisting device. When the replenisher 190 is placed in the standby attitude, the rotary air cylinder 150 may or may not be operated in a direction for contact of the roller 330 with the cam 338. Where the rotary air cylinder 150 is operated bidirectionally, the cam and cam follower may be eliminated, and the holder plate is pivoted in the opposite directions by the bidirectional operation of the rotary air cylinder 150, to change the attitude of the replenisher 190.

Further, the rotary air cylinder provided to applying a force for pivoting the holder plate may be a single-acting rotary air cylinder. Where the attitude of the replenisher 190 is changed from the solder-replenishing attitude to the standby attitude when the first bracket 118 is moved downwards, as in the embodiment of FIGS. 1–16, the pressurized air is supplied to the air chamber of the cylinder to pivot the holder plate for changing the attitude of the replenisher from the solder-replenishing attitude to the standby attitude. In the other condition, the pressurized air is not supplied to the air chamber, and a biasing force of a spring acts on the holder plate in a direction for a pivoting motion to change the attitude of the replenisher from the standby attitude to the solder-replenishing attitude. In this arrangement, the rotary air cylinder produces an assisting force for pivoting the holder plate to change the attitude of the replenisher from the solder-replenishing attitude to the standby attitude, and functions to maintain the solder-replenishing and standby attitudes, while the attitude is changed from the standby attitude to the solder-replenishing attitude by rolling contact of the roller with the cam surface. Where the attitude of the replenisher 190 is changed from the solder-replenishing attitude to the standby attitude when the first bracket 118 is moved upwards, as in the second embodiment of FIG. 17, a biasing force of a spring preferably acts on the holder plate in a direction for a pivoting motion to change the attitude to the standby attitude. The cam and cam follower may be eliminated where the rotary air cylinder is a single-acting rotary air cylinder.

Where a plurality of rotary air cylinders are operated in only one direction, these rotary air cylinders are held at rest, except when the replenisher 190 is placed in the solder-replenishing attitude and when the attitude is changed from the standby attitude to the solder-replenishing attitude. The rotary air cylinders may be operated only when the replenisher is placed in the solder-replenishing attitude.

In addition, it is possible to eliminate the attitude-holding device for maintaining the presently selected attitude, and provide only a positioning device for defining the angular position of the holder plate when the replenisher is placed in each of the standby attitude and the solder-replenishing attitude.

Further, while the attitude-changing device used in the illustrated embodiments includes the cam and cam follower, the attitude-changing device includes an exclusive drive source. For instance, the rotary air cylinder is operated bidirectionally to pivot the holder plate, as described above, to change the attitude of the replenisher 190. Alternatively, an electric motor provided in place of the rotary air cylinder is operated to pivot the holder plate, to change the attitude of the replenisher 190.

The attitude-holding device for maintaining the attitude of the replenisher or the replenisher biasing device may be constituted by a spring member, for instance. The spring member may be disposed to bias the holder plate in a direction for abutting contact of the projection 353 with the stop 354. In this case, the holder plate is pivoted by the biasing force of the spring, to change the attitude of the replenisher from the solder-replenishing attitude to the standby attitude. Alternatively, the attitude-holding device may include a magnet. For example, one of the projection 352 and stop 354 provided to limit the pivoting motion of the holder plate 130 by the rotary air cylinder 150 is constituted by a magnet, and the other is formed of a ferromagnetic material. In this case, the holder plate 130 is held in engagement with the first bracket 118 with a magnetic force acting between the magnet and the ferromagnetic material, for thereby maintaining the solder-replenishing attitude of the replenisher 190. In this instance, the rotary air cylinder 150 may or may not be provided.

The attitude of the replenisher may be changed at a position lower than the solder-replenishing position, or at either of a position lower than the solder-replenishing position and a position higher than the retracted position. Further, the attitude may be changed at a position between the solder-replenishing and retracted positions, and the standby attitude may be maintained at the retracted position.

Further, the elevator device for vertically moving the first bracket may be constituted by a single-acting fluid-actuated cylinder. In this case, a biasing force of a spring preferably acts on the first bracket in the upward direction, where the fluid-actuated cylinder is operated to establish the standby attitude of the replenisher when the first bracket is located at the uppermost position, and in the downward direction, where the fluid-actuated cylinder is operated to establish the standby attitude of the replenisher when the first bracket is located at the lowermost position. This arrangement does not require consumption of an energy by the elevator device for maintaining the standby attitude.

The horizontal drive device 102 and the elevator device 122 may use an electric motor as a drive source. In this case, a rotary motion of the electric motor is converted into a linear motion of the first and second brackets, by a motion converting device which includes a feedscrew and a nut, for instance.

The holder sleeve 180 may be made of a metallic material. At least one of the syringe 194, sleeve 220 and retainer ring 254 may be made of a metallic material.

Although the cutting wire is attached to the delivery nozzle in the illustrated embodiments, the cutting wire may be attached to the solder container of the replenisher, or to a member other than the replenisher. For instance, the cutting wire may be attached to the holder sleeve of the holding device provided to hold the replenisher, or to the fixing device for fixing the holder sleeve to the bracket.

The replenisher may be reciprocated at least one along the solder-replenishing area, namely, along the length of the printing-agent replenishment object in the form of the solder dispenser 50, when the object is replenished with the printing agent.

The vertical movement of the replenisher between the solder-replenishing position and the retracted position and the horizontal movement of the second bracket (replinisher) between the standby position and the solder-replenishing area may be effected simultaneously.

The principle of the present invention is applicable to a printing-agent repleneshing device for a screen printer of a type wherein a printing agent is applied to a workpiece by moving a squeegee to sweep a mass of the printing agent placed on the printing screen (stencil). In this case, the printing-agent replenishment object to be replenished with the printing agent is the screen, and the printing agent is directly introduced onto the screen.

While the presently preferred embodiments of this invention have been described in detail, for illustrative purpose only, it is to be understood that the present invention may be embodied with various other changes, modifications and improvements, such as those described in the summary of the invention, which may occur to those skilled in the art, without departing from the spirit and scope of the invention defined in the following claims.

What is claimed is:

1. A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:
- a rotary member mounted on said replenisher rotatably about an axis of said delivery nozzle; and
- a cutting wire attached to said rotary member such that said cutting wire traverses an opening in a face of a free end of said delivery nozzle,
- wherein the printing-agent replenishing device further comprises:
  - a holding member which holds said replenisher, and a rotary drive device including a drive source, disposed on said holding member and operable to rotate said rotary member,
  - wherein the printing agent replenishing device further comprises a replenisher-holding device provided on said holding member and arranged to removably hold said replenisher, and
  - wherein said rotary drive device further includes a driving rotary element, and a driven rotary element which is mounted on said replenisher such that said driven rotary element is rotatable with said rotary member, and such that said driven rotary element is engageable with said driving rotary element when said replenisher is held by said replenisher-holding device, and is disengageable from said driving rotary element when said replenisher is removed from said replenisher-holding device.

2. The printing-agent replenishing device according to claim 1, wherein said replenisher-holding device includes:
- a holder sleeve for removably holding said container; and
- a fixing device for fixing said holder sleeve to said holding member.

3. The printing-agent replenishing device according to claim 1, wherein said cutting wire includes a transverse portion traversing said opening in the face of said free end of said delivery nozzle, said transverse portion including an inward projection which projects into a free end portion of said delivery nozzle which has said opening.

4. The printing-agent replenishing device according to claim 3, wherein said inward projection is shaped such that a distance of said inward projection in an axial direction of said delivery nozzle from a plane including the face of said free end of said delivery nozzle is largest at a center of said opening and decreases as said inward projection extends in a radially outward direction of said opening, and wherein said cutting wire further includes opposite end portions located outside said opening as seen in said plane.

5. The printing-agent replenishing device according to claim 1, wherein said cutting wire is held in contact with the face of said end face of said delivery nozzle.

6. The printing-agent replenishing device according to claim 5, wherein said cutting wire is held in contact with the face of said end face of said delivery nozzle under an elastic force of said cutting wire.

7. The printing-agent replenishing device according to claim 6, wherein said cutting wire includes a contact portion held in contact with the face of said free end of said delivery nozzle, an engaging portion engageable with said rotary member, and an elastically deforming portion interposed between said engaging portion and said contact portion, said contact portion being held in pressing contact said face of said free end by an elastic force generated by said elastically deforming portion.

8. The printing-agent replenishing device according to claim 7, wherein said cutting wire includes a transverse portion which traverses said opening in the face of said free end portion of said delivery nozzle and which includes said contact portion, and said engaging portion consists of a pair of opposite engaging end portions engageable with respective two engaging portions of said rotary member which are located at respective circumferential positions of said rotary member that are opposed to each other in a diametric direction of said rotary member, said cutting wire including a pair of connecting portions connecting said opposite engaging end portions and opposite ends of said transverse portion, such that said opposite engaging end portions and said opposite ends of said transverse portion are located at respective different positions as viewed in a circumferential direction of said delivery nozzle, each of said pair of connecting portions including at least said elastically deforming portion.

9. The printing-agent replenishing device according to claim 1, wherein said rotary member is a sleeve rotatably mounted on an outer circumferential surface of a free end portion of said delivery nozzle which has said opening.

10. The printing-agent replenishing device according to claim 1, further comprising:
- a bracket which holds said holding member such that said holding member is vertically movable; and
- an elevator device interposed between said holding member and said bracket and operable to move said holding member in an almost vertical direction between a printing-agent-replenishing position in which said printing-agent replenishment object is replenished with said printing agent by said replenisher, and a retracted position which is located above said printing-agent-replenishing position.

11. The printing-agent replenishing device according to claim 1, further comprising:
- a bracket which holds said holding member such that said holding member is pivotable about a pivot axis extending in a substantially horizontal direction; and
- an attitude-changing device operable to pivot said holding member about said pivot axis, for thereby changing an attitude of said replenisher to a selected one of at least two attitudes including a printing-agent-replenishing attitude in which said delivery nozzle extends generally downwards, and a standby attitude in which said a longitudinal direction of said delivery nozzle is closer to a horizontal direction than when said replenisher is in said printing-agent-replenishing attitude.

12. The printing-agent replenishing device according to claim 1, further comprising:
- a movable member which holds said replenisher and which is movable in a horizontal direction; and
- a movable-member drive device operable to move said movable member.

13. The printing-agent replenishing device according to claim 1, further comprising:
- a first bracket which holds said holding member such that said holding member is pivotable about a pivot axis extending in a substantially horizontal direction;
- a second bracket which holds said first bracket such that said first bracket is movable in a substantially vertical direction;
- an elevator device interposed between said first and second brackets and operable to move said holding member in an almost vertical direction between a printing-agent-replenishing position in which said printing-agent replenishment object is replenished with said printing agent by said replenisher, and a retracted position which is located above said printing-agent-replenishing position;

a cam disposed at a standby position spaced apart from said printing-agent replenishment object in a horizontal direction;

a cam follower disposed on said holding member; and a horizontal drive device operable to move said second bracket to said standby position in which said cam follower is engageable with said cam, and wherein said cam is shaped such that a vertical motion of said first bracket when said second bracket is located at said standby position is converted, by engagement of said cam and said cam follower with each other during said vertical movement, into a pivotal motion of said holding Member to establish a substantially horizontal posture of said replenisher.

14. The printing-agent replenishing device according to claim 1, further comprising a delivery control device operable to control a pressure in an upper space within said container of said replenisher, for thereby controlling a delivery of the printing agent from said container through said delivery nozzle.

15. The printing-agent replenishing device according to claim 14, wherein said delivery control device includes:

a positive pressure source;

a negative pressure source; and a directional control valve device operable to effect selective communication of said upper space of said container with one of said positive and negative pressure sources.

16. The printing-agent replenishing device according to claim 15, wherein said directional control valve device is operable to selectively establish a pressurizing state in which said upper space is in communication with said positive pressure source, a sucking state in which said upper space is in communication with said negative pressure source, and a neutral state in which said upper space is in communication with the atmosphere.

17. The printing-agent replenishing device according to claim 1, further comprising:

a delivery control device operable to selectively establish a positive pressure, an atmospheric pressure and a negative pressure in an upper space within said container of said replenisher, for thereby controlling a delivery of the printing agent from said container through said delivery nozzle;

a main control device connected to said delivery control device and said rotary drive device, and operable to control said delivery control device and said rotary drive device such that said upper space is held at said positive pressure to replenish said printing-agent replenishment object with the printing agent, such that said rotary drive device is operated to rotate said rotary member after said upper space has been held at said atmospheric pressure for a predetermined first time, and such that said rotary drive device is again operated to again rotate said rotary member after said upper space has been held at said negative pressure for a predetermined second time.

18. A printing-agent replenishing device including a replenisher which has a container for accommodating a printing-agent and a delivery nozzle disposed at one end of the container and which is operable to deliver the printing agent from the delivery nozzle, for replenishing a printing-agent replenishment object in a screen printer, comprising:

a cutting wire for cutting off a mass of said printing agent which extends from a free end of said delivery nozzle, and a cutting-wire holding device which holds said cutting wire such that the cutting wire is held in contact with or in close proximity to a face of said free end of the delivery nozzle, so as to traverse an opening in said face of said free end, and such that said cutting wire is rotatable about an axis substantially aligned with an axis of said delivery nozzle, wherein said cutting wire includes a transverse portion traversing said opening in the face of said free end of said delivery nozzle, said transverse portion including an inward projection which projects into a free end portion of said delivery nozzle which has said opening.

19. The printing-agent replenishing device according to claim 18, wherein said inward projection is shaped such that a distance of said inward projection in an axial direction of said delivery nozzle from a plane including the face of said free end of said delivery nozzle is largest at a center of said opening and decreases as said inward projection extends in a radially outward direction of said opening, and wherein said cutting wire further includes opposite end portions located outside said opening as seen in said plane.

20. The printing-agent replenishing device according to claim 18, wherein said cutting wire is held in contact with the face of said end face of said delivery nozzle.

21. The printing-agent replenishing device according to claim 20, wherein said cutting wire is held in contact with the face of said end face of said delivery nozzle under an elastic force of said cutting wire.

22. The printing-agent replenishing device according to claim 18, further comprising:

a holding member which holds said replenisher;

a bracket which holds said holding member such that said holding member is vertically movable; and an elevator device interposed between said holding member and said bracket and operable to move said holding member in an almost vertical direction between a printing-agent-replenishing position in which said printing-agent replenishment object is replenished with said printing agent by said replenisher, and a retracted position which is located above said printing-agent-replenishing position.

23. The printing-agent replenishing device according to claim 18, further comprising:

a holding member which holds said replenisher;

a bracket which holds said holding member such that said holding member is pivotable about a pivot axis extending in a substantially horizontal direction; and an attitude-changing device operable to pivot said holding member about said pivot axis, for thereby changing an attitude of said replenisher to a selected one of at least two attitudes including a printing-agent-replenishing attitude in which said delivery nozzle extends generally downwards, and a standby attitude in which said a longitudinal direction of said delivery nozzle is closer to a horizontal direction than when said replenisher is in said printing-agent-replenishing attitude.

24. The printing-agent replenishing device according to claim 18, further comprising:

a movable member which holds said replenisher and which is movable in a horizontal direction; and a movable-member drive device operable to move said movable member.

25. The printing-agent replenishing device according to claim 18, further comprising:

a holding member which holds said replenisher;

a first bracket which holds said holding member such that said holding member is pivotable about a pivot axis extending in a substantially horizontal direction;

a second bracket which holds said first bracket such that said first bracket is movable in a substantially vertical direction;

an elevator device interposed between said first and second brackets and operable to move said holding member in an almost vertical direction between a printing-agent-replenishing position in which said printing-agent replenishment object is replenished with said printing agent by said replenisher, and a retracted position which is located above said printing-agent-replenishing position;

a cam disposed at a standby position spaced apart from said printing-agent replenishment object in a horizontal direction;

a cam follower disposed on said holding member; and a horizontal drive device operable to move said second bracket to said standby position in which said cam follower is engageable with said cam, and wherein said cam is shaped such that a vertical motion of said first bracket when said second bracket is located at said standby position is converted, by engagement of said cam and said cam follower with each other during said vertical movement, into a pivotal motion of said holding member to establish a substantially horizontal posture of said replenisher.

26. The printing-agent replenishing device according to claim 18, further comprising a delivery control device operable to control a pressure in an upper space within said container of said replenisher, for thereby controlling a delivery of the printing agent from said container through said delivery nozzle.

27. The printing-agent replenishing device according to claim 26, wherein said delivery control device includes:

a positive pressure source;

a negative pressure source; and a directional control valve device operable to effect selective communication of said upper space of said container with one of said positive and negative pressure sources.

28. The printing-agent replenishing device according to claim 27, wherein said directional control valve device is operable to selectively establish a pressurizing state in which said upper space is in communication with said positive pressure source, a sucking state in which said upper space is in communication with said negative pressure source, and a neutral state in which said upper space is in communication with the atmosphere.

29. A printing-agent replenishing device including a replenisher which has a container for accommodating a printing-agent and a delivery nozzle disposed at one end of the container and which is operable to deliver the printing agent from the delivery nozzle, for replenishing a printing-agent replenishment object in a screen printer, comprising:

a cutting wire for cutting off a mass of said printing agent which extends from a free end of said delivery nozzle; and a cutting-wire holding device which holds said cutting wire such that the cutting wire is held in contact with or in close proximity to a face of said free end of the delivery nozzle, so as to traverse an opening in said face of said free end, and such that said cutting wire is rotatable about an axis substantially aligned with an axis of said deliver nozzle, wherein said cutting wire is held in contact with the face of said end face of said delivery nozzle under an elastic force of said cutting wire, wherein said cutting wire includes a contact portion held in contact with the face of said free end of said delivery nozzle, an engaging portion engageable with said cutting-wire holding device, and an elastically deforming portion interposed between said engaging portion and said contact portion, said contact portion being held in pressing contact with said face of said free end by an elastic force generated by said elastically deforming portion.

30. The printing-agent replenishing device according to claim 29, wherein said cutting wire includes a transverse portion which traverses said opening in the face of said free end portion of said delivery nozzle and which includes said contact portion, and said engaging portion consists of a pair of opposite engaging end portions engageable with respective two engaging portions of said cutting-wire holding device which are located at respective circumferential positions of said cutting-wire holding device that are opposed to each other in a diametric direction of said cutting-device, said cutting wire including a pair of connecting portions connecting said opposite engaging end portions and opposite ends of said transverse portion, such that said opposite engaging end portions and said opposite ends of said transverse portion are located at respective different positions as viewed in a circumferential direction of said delivery nozzle, each of said pair of connecting portions including at least said elastically deforming portion.

31. A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:

a rotary member mounted on said replenisher rotatably about an axis of said delivery nozzle; and a cutting wire attached to said rotary member such that said cutting wire traverses an opening in a face of a free end of said delivery nozzle, wherein said rotary member is a sleeve rotatably mounted on an outer circumferential surface of a free end portion of said delivery nozzle which has said opening, wherein said outer circumferential surface of said free end portion of said delivery nozzle has an annular groove, and said sleeve has a plurality of through-holes formed through a cylindrical wall thereof in a radial direction thereof such that said through-holes are spaced from each other in a circumferential direction of said cylindrical wall, said replenisher being provided with a generally C-shaped elastic ring which includes a plurality of engaging projections which extend in a radially inward direction thereof and which are fitted on an outer circumferential surface of said sleeve such that said engaging projections extend through said through-holes, respectively, and are fitted at radially inward ends in said annular groove.

32. The printing agent replenishing device according to claim 31, further comprising:

a holding member which holds said replenisher; and a rotary drive device including a drive source, disposed on said holding member and operable to rotate said rotary member.

33. The printing-agent replenishing device according to claim 32, wherein said rotary drive device includes:
- a driven rotary element rotatable with said rotary member;
- a rotary drive source supported by said holding member and serving as said drive source; and
- a rotary-motion transmitting device operable to transmit a rotary motion of said rotary drive device to said driven rotary element.

34. The printing-agent replenishing device according to claim 31, wherein said plurality of engaging projections of said generally C-shaped elastic ring consist of two arcuate engaging projections which are formed at two mutually diametrically opposed circumferential positions of said elastic ring and which have an arcuate shape partly defined by a circumference of said elastic ring, said plurality of through-holes of said sleeve consisting of two arcuate slots which are formed at two mutually diametrically opposed circumferential positions of said sleeve and through which said two arcuate engaging projections extend for engagement with said annular groove.

35. The printing-agent replenishing device according to claim 31, wherein said cutting wire includes a pair of engaging portions engageable with respective two engaging portions formed in the outer circumferential surface of said sleeve, and said replenisher is provided with a substantially cylindrical retainer ring which has a radially inward flange at one axial end thereof and which is fitted on the outer circumferential surface of the sleeve such that said retainer ring is axially movable relative to said sleeve and such that said retainer ring covers said pair of engaging portions of said cutting wire in engagement with said two engaging portions, while said radially inward flange is sandwiched between said elastic ring and portions of said cutting wire adjacent said pair of engaging portions.

36. A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:
- a cutting wire for cutting off a mass of said printing agent which extends from a free end of said delivery nozzle; and
- a cutting-wire holding device which holds said cutting wire such that the cutting wire is held in contact with or in close proximity to a face of said free end of the delivery nozzle, so as to traverse an opening in said face of said free end, and such that said cutting wire is rotatable about an axis substantially aligned with an axis of said delivery nozzle,
- wherein the cutting-wire holding device comprises a rotary member which is mounted on said replenisher rotatably about an axis of said delivery nozzle and to which said cutting wire is attached, and
- wherein the printing-agent replenishing device further comprises:
  - a delivery control device operable to selectively establish a positive pressure, an atmospheric pressure and a negative pressure in an upper space within said container of said replenisher, for thereby controlling a delivery of the printing agent from said container through said delivery nozzle;
  - a rotary drive device operable to rotate said rotary member; and
  - a main control device connected to said delivery control device and said rotary drive device, and operable to control said delivery control device and said rotary drive device such that said upper space is held at said positive pressure to replenish said printing-agent replenishment object with the printing agent, such that said rotary drive device is operated to rotate said rotary member after said upper space has been held at said atmospheric pressure for a predetermined first time, and such that said rotary drive device is again operated to again rotate said rotary member after said upper space has been held at said negative pressure for a predetermined second time.

37. A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:
- a holding member which holds said replenisher;
- a bracket which holds said holding member such that said holding member is pivotable about a pivot axis extending in a substantially horizontal direction; and
- an attitude-changing device operable to pivot said holding member about said pivot axis, for thereby changing an attitude of said replenisher to a selected one of at least two attitudes including a printing-agent-replenishing attitude in which said delivery nozzle extends generally downwards, and a standby attitude in which a longitudinal direction of said delivery nozzle is closer to a horizontal direction than when said replenisher is in said printing-agent-replenishing attitude.

38. The printing-agent replenishing device according to claim 37, further comprising:
- a cutting wire for cutting off a mass of said printing agent which extends from a free end of said delivery nozzle; and
- a cutting-wire holding device which holds said cutting wire such that the cutting wire is held in contact with or in close proximity to a face of said free end of the delivery nozzle, so as to traverse an opening in said face of said free end, and such that said cutting wire is rotatable about an axis substantially aligned with an axis of said delivery nozzle.

39. A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:
- a holding member which holds said replenisher;
- a first bracket which holds said holding member such that said holding member is pivotable about a pivot axis extending in a substantially horizontal direction;
- a second bracket which holds said first bracket such that said first bracket is movable in a substantially vertical direction;
- an elevator device interposed between said first and second brackets and operable to move said holding member in an almost vertical direction between a printing-agent-replenishing position in which said printing-agent replenishment object is replenished with said printing agent by said replenisher, and a retracted position which is located above said printing-agent-replenishing position;
- a cam disposed at a standby position spaced apart from said printing-agent replenishment object in a horizontal direction;

a cam follower disposed on said holding member; and a horizontal drive device operable to move said second bracket to said standby position in which said cam follower is engageable with said cam, and wherein said cam is shaped such that a vertical motion of said first bracket when said second bracket is located at said standby position is converted, by engagement of said cam and said cam follower with each other during said vertical movement, into a pivotal motion of said holding member to establish a substantially horizontal posture of said replenisher.

40. The printing-agent replenishing device according to claim 39, further comprising:

a cutting wire for cutting off a mass of said printing agent which extends from a free end of said delivery nozzle; and a cutting-wire holding device which holds said cutting wire such that the cutting wire is held in contact with or in close proximity to a face of said free end of the delivery nozzle, so as to traverse an opening in said face of said free end, and such that said cutting wire is rotatable about an axis substantially aligned with an axis of said delivery nozzle.

41. A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:

a holding member which holds said replenisher;

a bracket which holds said holding member such that said holding member is pivotable about a pivot axis extending in a substantially horizontal direction;

a cam disposed at a standby position spaced apart from said printing-agent replenishment object in a horizontal direction;

a cam follower disposed on said holding member; and a horizontal drive device operable to move said bracket to said standby position in which said cam follower is engageable with said cam, and wherein said cam is shaped such that a horizontal motion of said bracket from a position near said standby position to said standby position is converted, by engagement of said cam and said cam follower with each other during said horizontal movement, into a pivotal motion of said holding member to establish a substantially horizontal posture of said replenisher.

42. A printing-agent replenishing device including a replenisher which has a container for accommodating a printing agent and a delivery nozzle disposed at one end of the container and which is operable to deliver the printing agent from the delivery nozzle, for replenishing a printing-agent replenishment object in a screen printer, comprising:

a holding member which holds said replenisher;

a first bracket which holds said holding member such that said holding member is pivotable about a pivot axis extending in a substantially horizontal direction;

a second bracket which holds said first bracket such that said first bracket is movable in a substantially vertical direction;

an elevator device interposed between said first and second brackets and operable to move said holding member in an almost vertical direction to a selected one of a printing-agent-replenishing position in which said printing-agent replenishment object is replenished with said printing agent by said replenisher, a retracted position which is located above said printing-agent-replenishing position, and an attitude-changing position which is located below said printing-agent-replenishing position or above said retracted position; and an attitude-changing device operable to convert a motion of said first bracket to said attitude-changing position into a pivotal motion of said holding member, for thereby changing an attitude of said replenisher from a printing-agent-replenishing attitude in which said delivery nozzle extends generally downwards, to a standby attitude in which a longitudinal direction of said delivery nozzle is closer to a horizontal direction than when said replenisher is in said printing-agent-replenishing attitude.

* * * * *